US010916705B2

(12) United States Patent
Boehm et al.

(10) Patent No.: US 10,916,705 B2
(45) Date of Patent: Feb. 9, 2021

(54) FORMULATIONS WITH A LOW PARTICLE CONTENT

(71) Applicants: Merck Patent GmbH, Darmstadt (DE); Seiko Epson Corporation, Tokyo (JP)

(72) Inventors: Edgar Boehm, Griesheim (DE); Anja Gerhard, Egelsbach (DE); Dietmar Kunkel, Gernsheim (DE); Volker Hilarius, Gross-Umstadt (DE); Uchida Masahiro, Suwa (JP); Sonoyama Takuya, Suwa (JP); Takei Shuichi, Suwa (JP); Imamura Koji, Suwa (JP)

(73) Assignees: Merck Patent GmbH, Darmstadt (DE); Seiko Epson Corporation, Suwa (JP)

( * ) Notice: Subject to any disclaimer, the term of this patent is extended or adjusted under 35 U.S.C. 154(b) by 70 days.

(21) Appl. No.: 15/546,040

(22) PCT Filed: Jan. 21, 2016

(86) PCT No.: PCT/EP2016/000109
§ 371 (c)(1),
(2) Date: Jul. 25, 2017

(87) PCT Pub. No.: WO2016/120007
PCT Pub. Date: Aug. 4, 2016

(65) Prior Publication Data
US 2018/0013067 A1 Jan. 11, 2018

(30) Foreign Application Priority Data

Jan. 30, 2015 (EP) .................................... 15000288

(51) Int. Cl.
*H01B 1/12* (2006.01)
*H01L 51/00* (2006.01)
*B05D 5/12* (2006.01)
*C09D 5/24* (2006.01)
*C09D 11/52* (2014.01)
*C09D 5/00* (2006.01)
*C09D 11/10* (2014.01)
*C09D 11/037* (2014.01)
*C09D 7/20* (2018.01)
*C09D 11/033* (2014.01)
*C09D 11/36* (2014.01)

(52) U.S. Cl.
CPC ............ *H01L 51/0025* (2013.01); *C09D 5/00* (2013.01); *C09D 5/24* (2013.01); *C09D 7/20* (2018.01); *C09D 11/033* (2013.01); *C09D 11/037* (2013.01); *C09D 11/10* (2013.01); *C09D 11/36* (2013.01); *C09D 11/52* (2013.01); *H01B 1/12* (2013.01); *H01L 51/004* (2013.01); *H01L 51/0005* (2013.01); *H01L 51/0007* (2013.01); *H01L 51/0037* (2013.01); *H01L 51/0047* (2013.01); *Y02E 10/549* (2013.01)

(58) Field of Classification Search
CPC ............ H01L 51/0025; H01L 51/0005; H01L 51/0007; H01L 51/0037; H01L 51/004; H01L 51/0047; C09D 7/20; C09D 5/00; C09D 5/24; C09D 11/033; C09D 11/037; C09D 11/10; C09D 11/36; C09D 11/52; Y02E 10/549; H01B 1/00; H01B 1/12; H01B 1/121; H01B 1/122; H01B 1/124; B05D 5/12
USPC ........................................................ 252/500
See application file for complete search history.

(56) References Cited

U.S. PATENT DOCUMENTS

| 6,905,785 | B2* | 6/2005 | Noguchi | ................ C08G 61/02 252/301.16 |
| 7,252,781 | B2 | 8/2007 | Spreitzer et al. | |
| 8,268,456 | B2* | 9/2012 | Koyama | ................ C09K 11/06 257/40 |
| 8,907,207 | B2 | 12/2014 | Oooka et al. | |
| 2002/0033910 | A1* | 3/2002 | Ohnishi | ................ C08G 61/02 349/69 |
| 2015/0021587 | A1 | 1/2015 | Mizukami et al. | |
| 2015/0140715 | A1 | 5/2015 | Imamura et al. | |
| 2015/0311445 | A1 | 10/2015 | Udaka et al. | |

FOREIGN PATENT DOCUMENTS

| EP | 1134269 A2 | 9/2001 |
| EP | 2302014 A1 | 3/2011 |
| JP | 2001214159 A | 8/2001 |
| JP | 2002-75642 A | 3/2002 |
| JP | 2002267831 A | 9/2002 |
| JP | 2002359073 A | 12/2002 |

(Continued)

OTHER PUBLICATIONS

International Search Report for PCT/EP2016/000109 dated May 6, 2016.

(Continued)

*Primary Examiner* — Mark Kopec
(74) *Attorney, Agent, or Firm* — Faegre Drinker Biddle & Reath LLP

(57) ABSTRACT

The present invention relates to formulations comprising at least one organic semiconductor and at least one organic solvent, characterized in that the formulation contains less than 10,000 particles per liter formulation having an average size in the range from 0.1 to 20 μm, to their use for the preparation of electronic devices, to methods for preparing electronic devices using the formulations of the present invention, and to electronic devices prepared from such methods and formulations.

19 Claims, No Drawings

(56) References Cited

FOREIGN PATENT DOCUMENTS

| | | | |
|---|---|---|---|
| JP | 2005532412 | A | 10/2005 |
| JP | 2010098306 | A | 4/2010 |
| JP | 2010212354 | A | 9/2010 |
| JP | 2012195516 | A | 10/2012 |
| JP | 201490156 | A | 5/2014 |
| WO | WO-2011076325 | A1 | 6/2011 |
| WO | WO-2013006478 | A1 | 1/2013 |
| WO | WO-2013154076 | A1 | 10/2013 |
| WO | WO-14073446 | A1 | 5/2014 |

OTHER PUBLICATIONS

Written Opinion of the International Searching Authority for PCT/EP2016/000109 dated May 6, 2016.

Held, Daniela, "Molmassenverteilung—wie breit ist breit?", GPC Tipps & Tricks Nr. 50, 2009, p. 49.

Liquid Particle Sensor KS-40B, 40BF (No pub date and no English language translation).

\* cited by examiner

FORMULATIONS WITH A LOW PARTICLE CONTENT

CROSS-REFERENCE TO RELATED APPLICATIONS

This application is a national stage application (under 35 U.S.C. § 371) of PCT/EP2016/000109, filed Jan. 21, 2016, which claims benefit of European Application No. 15000288.9, filed Jan. 30, 2015, both of which are incorporated herein by reference in their entirety.

FIELD OF THE INVENTION

The present invention relates to formulations of soluble organic or hybrid functional materials for coating or inks for printing of layers of electronic or optoelectronic devices comprising at least one organic semiconductor and at least one organic solvent, characterized in that the formulation contains less than 10,000 particles per liter formulation having an average size in the range from 0.1 to 20 μm, to their use for the preparation of electronic or optoelectronic devices, such as liquid coated or printed electronic, optoelectronic, photovoltaic, sensoric or organic electroluminescent devices, to methods for preparing such devices using the formulations of the present invention, and to devices prepared from such methods and formulations.

BACKGROUND AND PRIOR ART

Organic electronic or optoelectronic devices have been fabricated for a long time by vacuum deposition processes. Other techniques such as inkjet printing have been recently thoroughly investigated because of their advantages such as cost savings and scale-up possibilities. One of the main challenges in multi-layer printing is to identify the relevant parameters to obtain a homogeneous deposition of inks on the substrate. For example, it is known that a reduction of particles in inks which are prepared for inkjet-printing gives rise to a good flowability of the ink and prevents clogging of the ink channels in the printing head. This ensures an uniform application of the ink on the substrate and reduces defects which are caused by decreased or no ink application.

EP 1134269 A2 relates to a polymeric fluorescent substance and a solution of the polymeric fluorescent substance which may be used for preparation of a polymer light-emitting device. It was found that a polymer light-emitting device which comprises at least one light-emitting layer containing substantially no particle-like foreign material with a diameter of more than 1 μm has few dark spots which deteriorate the display quality. However, it is not considered in the state of the art whether the presence of particles in the submicrometer range has an influence on the formation of defects in the layer structure of a polymer light-emitting device. The present invention addresses this issue and provides a comprehensive study on the occurrence and causes of defects in the layers of electronic or optoelectronic devices which are prepared from solutions of organic semiconducting materials.

Hence, an object of the present invention is to provide a formulation comprising one or more semiconducting materials and one or more organic solvents which is suitable for the preparation of electronic or optoelectronic devices having a reduced number of defects.

SUMMARY OF THE INVENTION

The present invention relates to a formulation comprising one or more organic semiconducting materials and one or more organic solvents, characterized in that it contains less than 10,000 particles per liter formulation having an average size in the range from 0.1 to 20 μm.

The formulation of the present invention comprises one or more organic semiconducting materials. The organic semiconducting materials can be selected either from low molecular weight materials or polymeric materials.

The organic semiconducting materials can be furthermore selected from hole injecting, hole transporting, electron blocking, light emitting, hole blocking, electron transporting, electron injecting, dielectric, and absorber materials.

The formulation of the present invention either contains a single organic semiconducting material or a mixture of two or more organic semiconducting materials. If the formulation of the present invention contains two or more organic semiconducting materials, the mixture can be composed of low molecular weight materials, of polymeric materials or a mixture of low molecular weight materials and polymeric materials, wherein the polymeric materials may be optionally present as precursors for polymeric materials.

If the organic semiconducting material is a low molecular weight material it has preferably a molecular weight $M_w$ of ≤5,000 g/mol.

If the organic semiconducting material is a polymer it has preferably a molecular weight $M_w$ of >5,000 g/mol.

The formulation of the present invention comprises one or more organic solvents. Consequently, the formulation of the present invention contains a single solvent or a mixture of two, three or more organic solvents.

In a preferred embodiment, at least one solvent of the formulation has a boiling point of ≥90° C., preferably of ≥150° C. and more preferably ≥200° C.

If the formulation of the present invention contains at least two different solvents, the difference of the boiling points of two solvents of the at least two different solvents is ≥10° C.

If the formulation of the present invention contains at least two different solvents, the difference of the vapour pressure of two solvents of the at least two different solvents is ≥a factor of 2, preferably ≥a factor of 10.

The components of the formulation, i.e. the one or more organic semiconductor as well as the one or more organic solvents are chosen in such a manner that the formulation of the present invention has preferably a viscosity of a ≥1.5 mPas, more preferably of a ≥2.0 mPas.

To further modify the properties of the formulation of the present invention, it can contain additives and/or auxiliaries. In one embodiment, the formulation of the present invention contains at least one polymeric binder as an additive.

A further object of the present invention is a process for the preparation of the formulation of the present invention. This object is achieved in that the one or more organic semiconducting materials are dissolved in one or more organic solvents and thereafter the formulation is filtered.

A further object of the present invention is the use of the formulation of the present invention for the preparation of at least one layer of an electronic device. The preparation of the at least one layer of an electronic device can be performed, without limitation, by dip coating, spin coating, ink jet printing, nozzle printing, letter-press printing, screen printing, gravure printing, doctor blade coating, roller printing, reverse-roller printing, offset lithography printing, flexographic printing, web printing, spray coating, curtain coating, brush coating, airbrush coating, slot dye coating or pad printing.

Consequently, an electronic device, wherein at least one layer is prepared using a formulation of the present invention is also object of the present invention. Preferably, the electronic device is selected from an organic light-emitting diode (OLED), an organic thin-film transistor (OTFT), an organic field-effect transistor (OFET), a solar cell, a sensor, an organic diode and a radio-frequency identification device (RFID) or an array of such elements or a circuit combined of such elements.

DETAILED DESCRIPTION OF THE INVENTION

The present invention relates to a formulation comprising one or more organic semiconducting materials and one or more organic solvents, characterized in that it contains less than 10,000 particles per liter formulation having an average size in the range from 0.1 to 20 µm.

In one embodiment, the formulation contains more than 700 particles per liter formulation having an average size in the range from 0.1 to 20 µm.

In a preferred embodiment the formulation of the present invention contains less than 1,000 particles per liter formulation having an average size in the range from 0.2 to 20 µm, more preferably less than 100 particles per liter formulation having an average size in the range from 0.5 to 20 µm.

In a further preferred embodiment the formulation of the present invention contains less than 10 metallic and/or electronically conducting particles per liter formulation having an average size in the range from 0.1 to 20 µm.

In one preferred embodiment of the present invention, the organic semiconducting materials are selected from low molecular weight materials.

If the organic semiconducting material is a low molecular weight material it has preferably a molecular weight $M_w$ of ≤5,000 g/mol, more preferably of ≤2,000 g/mol and most preferably of ≤1,500 g/mol.

The organic semiconducting materials can be selected from standard materials known to the skilled person and described in the literature having a molecular weight of at most 5,000 g/mol. Preferably, the composition comprises an organic light emitting material and/or a charge transport material. Organic light emitting material according to the present application means a material which emits light having a $\lambda_{max}$ in the range from 300 to 800 nm.

The formulation according to the present invention can comprise between 0.01 and 20% by weight, preferably between 0.1 and 15% by weight, more preferably between 0.2 and 10% by weight and most preferably between 0.25 and 5% by weight, of the organic light emitting materials and/or charge transport materials or the corresponding blend. The percent data relate to 100% of the solvent or solvent mixture.

The light emitting material or the charge transport material (below together named as organic semiconductor) used here is either a pure component or a mixture of two or more components. The organic light emitting materials and/or charge transport materials preferably include phosphorescent compounds.

Suitable phosphorescent compounds are, in particular, compounds which emit light, preferably in the visible region, on suitable excitation and in addition contain at least one atom having an atomic number greater than 20, preferably greater than 38 and less than 84, more preferably greater than 56 and less than 80. The phosphorescence emitters used are preferably compounds which contain copper, molybdenum, tungsten, rhenium, ruthenium, osmium, rhodium, iridium, palladium, platinum, silver, gold or europium, in particular compounds which contain iridium or platinum.

Particularly preferred organic phosphorescent compounds are compounds of formulae (1) to (4):

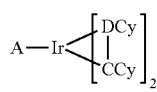

formula (1)

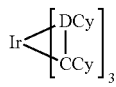

formula (2)

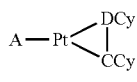

formula (3)

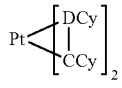

formula (4)

where

DCy is, identically or differently on each occurrence, a cyclic group which contains at least one donor atom, preferably nitrogen, carbon in the form of a carbene or phosphorus, via which the cyclic group is bonded to the metal, and which may in turn carry one or more substituents $R^1$; the groups DCy and CCy are connected to one another via a covalent bond;

CCy is, identically or differently on each occurrence, a cyclic group which contains a carbon atom via which the cyclic group is bonded to the metal and which may in turn carry one or more substituents $R^1$;

A is, identically or differently on each occurrence, a monoanionic, bidentate chelating ligand, preferably a diketonate ligand;

$R^1$ are identically or differently at each instance, and are F, Cl, Br, I, $NO_2$, CN, a straight-chain, branched or cyclic alkyl or alkoxy group having from 1 to 20 carbon atoms, in which one or more nonadjacent $CH_2$ groups may be replaced by —O—, —S—, —$NR^2$—, —$CONR^2$—, —CO—O—, —C═O—, —CH═CH— or —C≡C—, and in which one or more hydrogen atoms may be replaced by F, or an aryl or heteroaryl group which has from 4 to 14 carbon atoms and may be substituted by one or more nonaromatic $R^1$ radicals, and a plurality of substituents $R^1$, either on the same ring or on the two different rings, may together in turn form a mono- or polycyclic, aliphatic or aromatic ring system; and $R^2$ are identically or differently at each instance, and are a straight-chain, branched or cyclic alkyl or alkoxy group having from 1 to 20 carbon atoms, in which one or more nonadjacent $CH_2$ groups may be replaced by —O—, —S—, —CO—O—, —C═O—, —CH═CH— or —C≡C—, and in which one or more hydrogen atoms may be replaced by F, or an aryl or heteroaryl group which has from 4 to 14 carbon atoms and may be substituted by one or more nonaromatic $R^1$ radicals.

Formation of ring systems between a plurality of radicals $R^1$ means that a bridge may also be present between the groups DCy and CCy. Furthermore, formation of ring systems between a plurality of radicals $R^1$ means that a bridge may also be present between two or three ligands CCy-DCy or between one or two ligands CCy-DCy and the ligand A, giving a polydentate or polypodal ligand system.

Examples of the emitters described above are revealed by the applications WO 00/70655, WO 01/41512, WO 02/02714, WO 02/15645, EP 1191613, EP 1191612, EP 1191614, WO 04/081017, WO 05/033244, WO 05/042550, WO 05/113563, WO 06/008069, WO 06/061182, WO 06/081973 and DE 102008027005. In general, all phosphorescent complexes as are used in accordance with the prior art for phosphorescent OLEDs and as are known to the person skilled in the art in the area of organic electroluminescence are suitable, and the person skilled in the art will be able to use further phosphorescent compounds without inventive step. In particular, it is known to the person skilled in the art which phosphorescent complexes emit with which emission colour.

Examples of preferred phosphorescent compounds are shown in WO 2011/076325 A1.

Preferred dopants are selected from the class of the monostyrylamines, the distyrylamines, the tristyrylamines, the tetrastyrylamines, the styryl-phosphines, the styryl ethers and the arylamines. A monostyrylamine is taken to mean a compound which contains one substituted or unsubstituted styryl group and at least one, preferably aromatic, amine. A distyrylamine is taken to mean a compound which contains two substituted or unsubstituted styryl groups and at least one, preferably aromatic, amine, A tristyrylamine is taken to mean a compound which contains three substituted or unsubstituted styryl groups and at least one, preferably aromatic, amine. A tetrastyrylamine is taken to mean a compound which contains four substituted or unsubstituted styryl groups and at least one, preferably aromatic, amine. The styryl groups are particularly preferably stilbenes, which may also be further substituted. Corresponding phosphines and ethers are defined analogously to the amines. For the purposes of the present invention, an arylamine or an aromatic amine is taken to mean a compound which contains three substituted or unsubstituted aromatic or heteroaromatic ring systems bonded directly to the nitrogen. At least one of these aromatic or heteroaromatic ring systems is preferably a condensed ring system, particularly preferably having at least 14 aromatic ring atoms. Preferred examples thereof are aromatic anthraceneamines, aromatic anthracenediamines, aromatic pyreneamines, aromatic pyrenediamines, aromatic chryseneamines or aromatic chrysenediamines. An aromatic anthraceneamine is taken to mean a compound in which one diarylamino group is bonded directly to an anthracene group, preferably in the 9-position. An aromatic anthracenediamine is taken to mean a compound in which two diarylamino groups are bonded directly to an anthracene group, preferably in the 9,10-position. Aromatic pyreneamines, pyrenediamines, chryseneamines and chrysenediamines are defined analogously thereto, where the diarylamino groups are preferably bonded to the pyrene in the 1-position or in the 1,6-position. Further preferred dopants are selected from indenofluoreneamines or indenofluorenediamines, for example in accordance with WO 06/122630, benzoindenofluoreneamines or benzo-indenofluorenediamines, for example in accordance with WO 08/006449, and dibenzoindenofluoreneamines or dibenzo-indenofluorenediamines, for example in accordance with WO 07/140847. Examples of dopants from the class of the styrylamines are substituted or unsubstituted tristilbeneamines or the dopants described in WO 06/000388, WO 06/058737, WO 06/000389, WO 07/065549 and WO 07/115610. Preference is furthermore given to the condensed hydrocarbons as disclosed in DE 102008035413.

Suitable dopants are furthermore the structures depicted in Table 1 and the derivatives of these structures disclosed in JP 06/001973, WO 04/047499, WO 06/098080, WO 07/065678, US 2005/0260442 and WO 04/092111.

TABLE 1

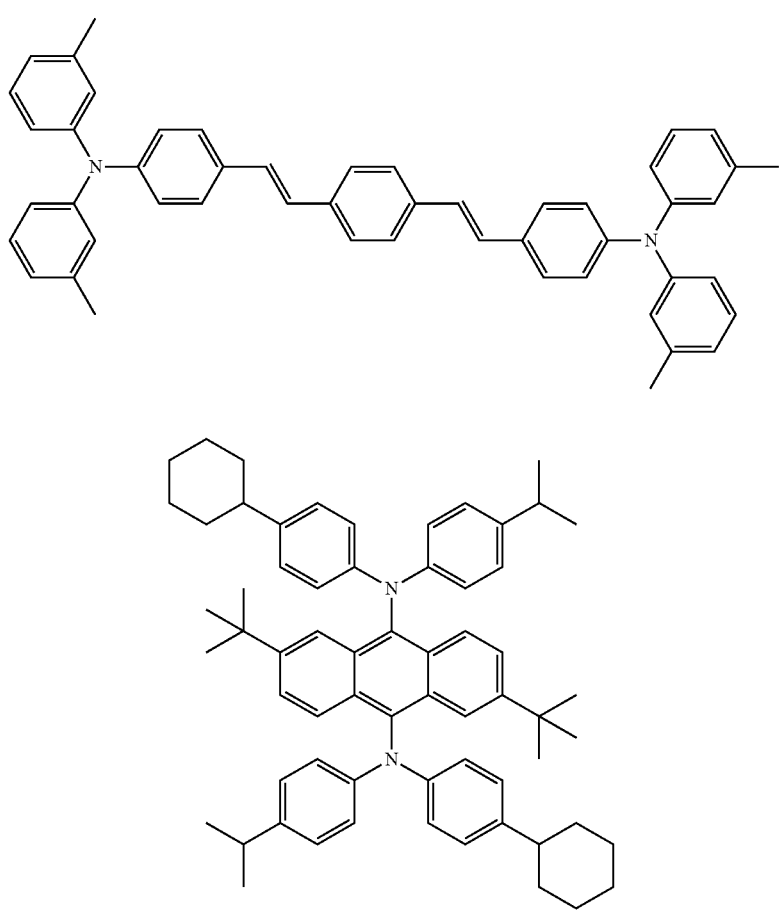

TABLE 1-continued
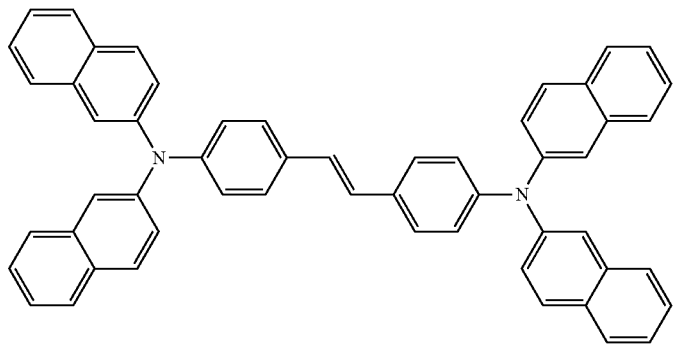 [SMILES: C(=C\c1ccc(N(c2ccc3ccccc3c2)c2ccc3ccccc3c2)cc1)/c1ccc(N(c2ccc3ccccc3c2)c2ccc3ccccc3c2)cc1]
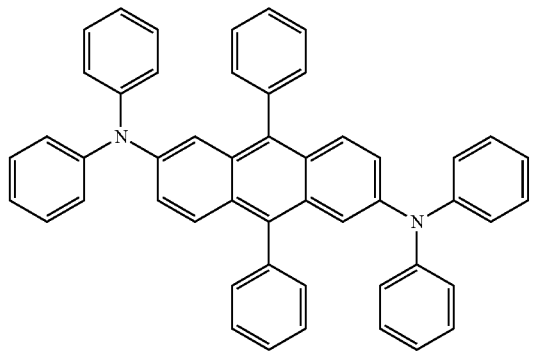 [SMILES: c1ccc(-c2c3ccc(N(c4ccccc4)c4ccccc4)cc3c(-c3ccccc3)c3ccc(N(c4ccccc4)c4ccccc4)cc23)cc1]
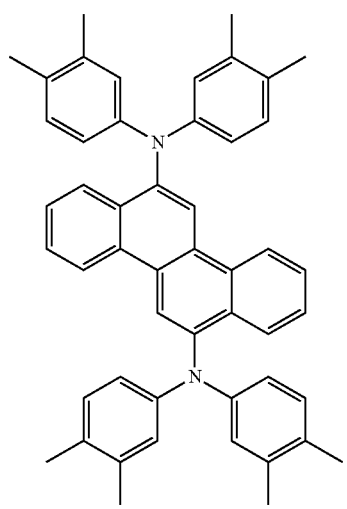
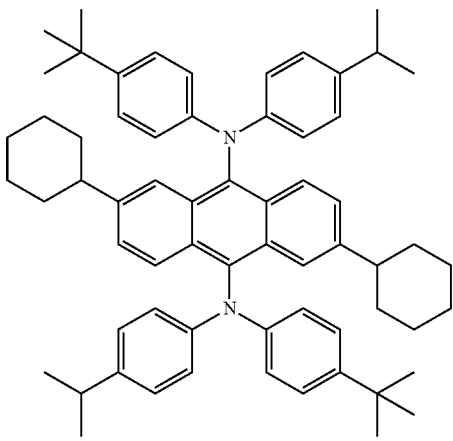 [SMILES: CC(C)c1ccc(N(c2ccc(C(C)(C)C)cc2)c2c3ccc(C4CCCCC4)cc3c(N(c3ccc(C(C)C)cc3)c3ccc(C(C)(C)C)cc3)c3ccc(C4CCCCC4)cc23)cc1]

Another group of dopants are short (oligo-) arylenevinylenes (for example DPVBi or spiro-DPVBi in accordance with EP 676461).

The proportion of the dopant in the mixture of the emitting layer is between 0.1 and 50.0% by weight, preferably between 0.5 and 20.0% by weight, particularly preferably between 1.0 and 10.0% by weight. Correspondingly, the proportion of the host material is between 50.0 and 99.9% by weight, preferably between 80.0 and 99.5% by weight, particularly preferably between 90.0 and 99.0% by weight.

Suitable host materials for this purpose are materials from various classes of substance. Preferred host materials are selected from the classes of the oligoarylenes (for example 2,2',7,7'-tetraphenylspirobifluorene in accordance with EP 676461 or dinaphthylanthracene), in particular the oligoarylenes containing condensed aromatic groups, the oligoarylenevinylenes, the polypodal metal complexes (for example in accordance with WO 04/081017), the hole-conducting compounds (for example in accordance with WO 04/058911), the electron-conducting compounds, in particular ketones, phosphine oxides, sulfoxides, etc. (for example in accordance with WO 05/084081 and WO 05/084082), the atropisomers (for example in accordance with WO 06/048268), the boronic acid derivatives (for example in accordance with WO 06/117052), the benzanthracenes (for example in accordance with WO 08/145239), the triazines or the benzimidazoles. Suitable host materials are furthermore also the benzo[c]phenanthrene compounds according to the invention which are described above. Apart from the compounds according to the invention, particularly preferred host materials are selected from the classes of the oligoarylenes containing naphthalene, anthracene, benzanthracene and/or pyrene or atropisomers of these compounds, the oligoarylenevinylenes, the ketones, the phosphine oxides and the sulfoxides. Apart from the benzo[c]phenanthrene compounds according to the invention, very particularly preferred host materials are selected from the classes of the oligoarylenes containing anthracene, benzanthracene and/or pyrene or atropisomers of these compounds. For the purposes of this invention, an oligoarylene is intended to be taken to mean a compound in which at least three aryl or arylene groups are bonded to one another.

Suitable host materials are furthermore, for example, the materials depicted in Table 2, and derivatives of these materials, as disclosed in WO 04/018587, WO 08/006449, U.S. Pat. No. 5,935,721, US 2005/0181232, JP 20001273056, EP 681019, US 2004/0247937 and US 2005/0211958.

TABLE 2

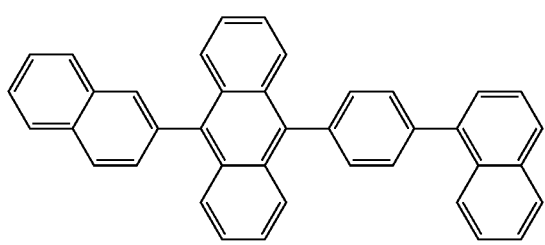 [SMILES: c1ccc2cc(-c3c4ccccc4c(-c4ccc(-c5cccc6ccccc56)cc4)c4ccccc34)ccc2c1]

TABLE 2-continued

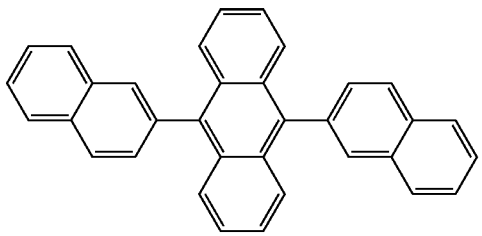 [SMILES: c1ccc2cc(-c3c4ccccc4c(-c4ccc5ccccc5c4)c4ccccc34)ccc2c1]

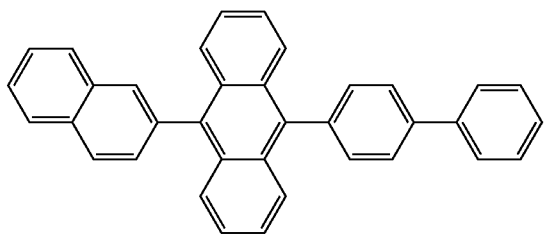 [SMILES: c1ccc(-c2ccc(-c3c4ccccc4c(-c4ccc5ccccc5c4)c4ccccc34)cc2)cc1]

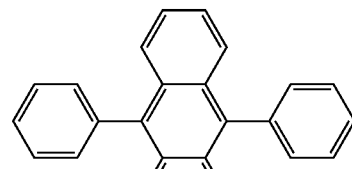

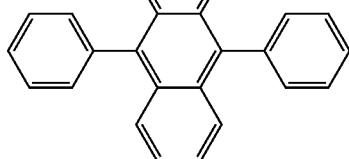

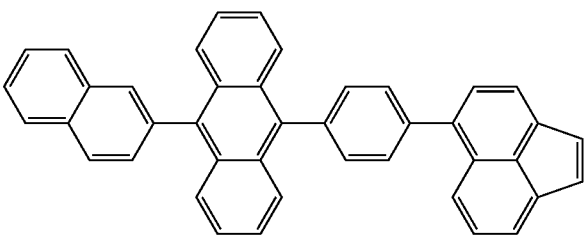 [SMILES: C1=Cc2ccc(-c3ccc(-c4c5ccccc5c(-c5ccc6ccccc6c5)c5ccccc45)cc3)c3cccc1c23]

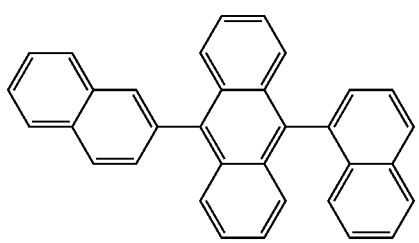 [SMILES: c1ccc2cc(-c3c4ccccc4c(-c4cccc5ccccc45)c4ccccc34)ccc2c1]

TABLE 2-continued

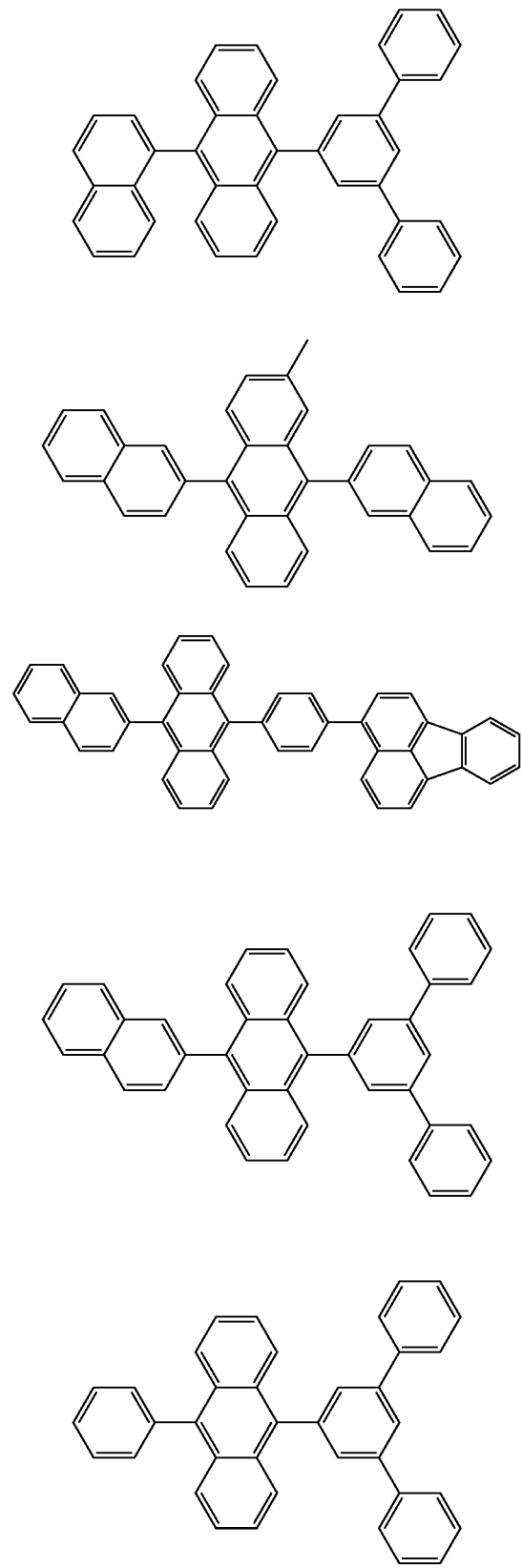

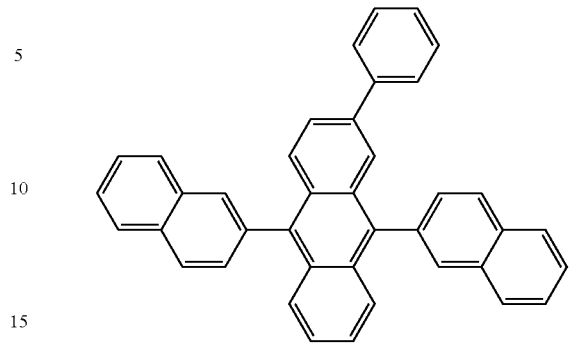

For the purposes of this invention, a hole-injection layer is a layer which is directly adjacent to the anode. For the purposes of this invention, a hole-transport layer is a layer which is located between a hole-injection layer and an emission layer. It may be preferred for them to be doped with electron-acceptor compounds, for example with $F_4$-TCNQ or with compounds as described in EP 1476881 or EP 1596445.

Apart from the materials according to the invention, suitable charge-transport materials, as can be used in the hole-injection or hole-transport layer or in the electron-injection or electron-transport layer of the organic electroluminescent device according to the invention, are, for example, the compounds disclosed in Y. Shirota et al., Chem. Rev. 2007, 107(4), 953-1010, or other materials as employed in these layers in accordance with the prior art.

Examples of preferred hole-transport materials which can be used in a hole-transport or hole-injection layer of the electroluminescent device according to the invention are indenofluoreneamines and derivatives (for example in accordance with WO 06/122630 or WO 06/100896), the amine derivatives as disclosed in EP 1661888, hexaazatriphenylene derivatives (for example in accordance with WO 01/049806), amine derivatives with condensed aromatics (for example in accordance with U.S. Pat. No. 5,061,569), the amine derivatives as disclosed in WO 95/009147, monobenzoindeno-fluoreneamines (for example in accordance with WO 08/006449) or dibenzoindenofluoreneamines (for example in accordance with WO 07/140847). Suitable hole-transport and hole-injection materials are furthermore derivatives of the compounds depicted above, as disclosed in JP 2001/226331, EP 676461, EP 650955, WO 01/049806, U.S. Pat. No. 4,780,536, WO 98/030071, EP 891121, EP 1661888, JP 2006/253445, EP 650955, WO 06/073054 and U.S. Pat. No. 5,061,569.

Suitable hole-transport or hole-injection materials are furthermore, for example, the materials indicated in Table 3.

TABLE 3
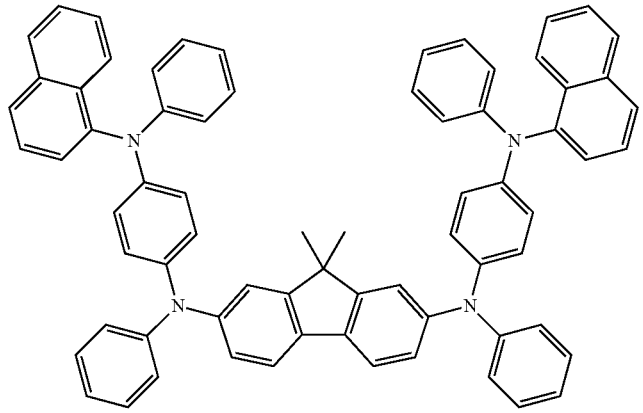 [SMILES: CC1(C)c2cc(N(c3ccccc3)c3ccc(N(c4ccccc4)c4cccc5ccccc45)cc3)ccc2-c2ccc(N(c3ccccc3)c3ccc(N(c4ccccc4)c4cccc5ccccc45)cc3)cc21]
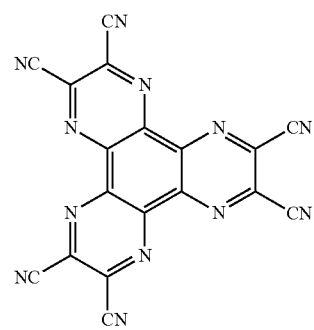 [SMILES: N#Cc1nc2c3nc(C#N)c(C#N)nc3c3nc(C#N)c(C#N)nc3c2nc1C#N]
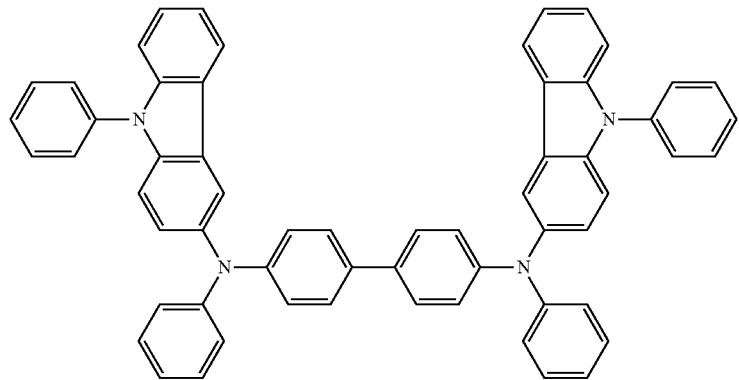 [SMILES: c1ccc(N(c2ccc(-c3ccc(N(c4ccccc4)c4ccc5c(c4)c4ccccc4n5-c4ccccc4)cc3)cc2)c2ccc3c(c2)c2ccccc2n3-c2ccccc2)cc1]

TABLE 3-continued
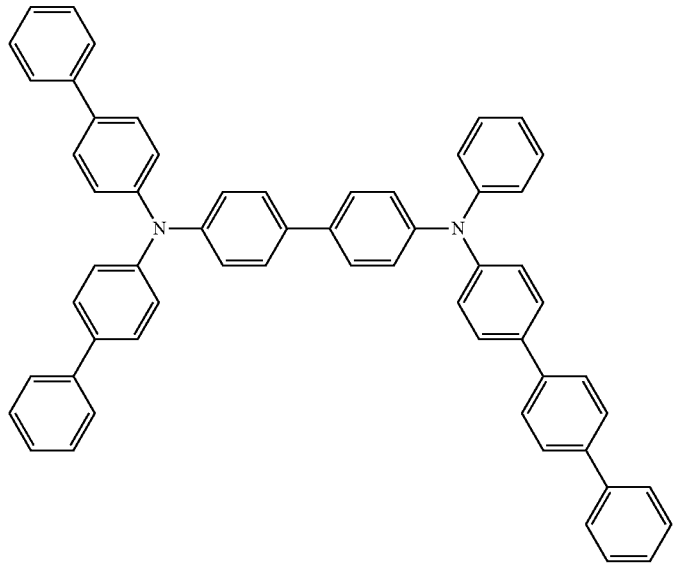 [SMILES: c1ccc(-c2ccc(-c3ccc(N(c4ccccc4)c4ccc(-c5ccc(N(c6ccc(-c7ccccc7)cc6)c6ccc(-c7ccccc7)cc6)cc5)cc4)cc3)cc2)cc1]
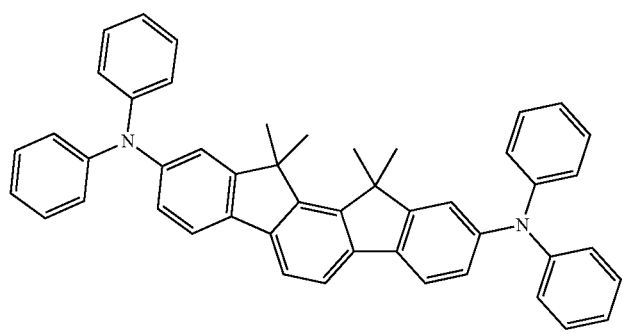 [SMILES: CC1(C)c2cc(N(c3ccccc3)c3ccccc3)ccc2-c2ccc3c(c21)C(C)(C)c1cc(N(c2ccccc2)c2ccccc2)ccc1-3]
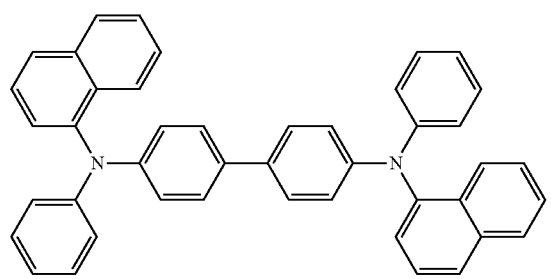 [SMILES: c1ccc(N(c2ccc(-c3ccc(N(c4ccccc4)c4cccc5ccccc45)cc3)cc2)c2cccc3ccccc23)cc1]

TABLE 3-continued
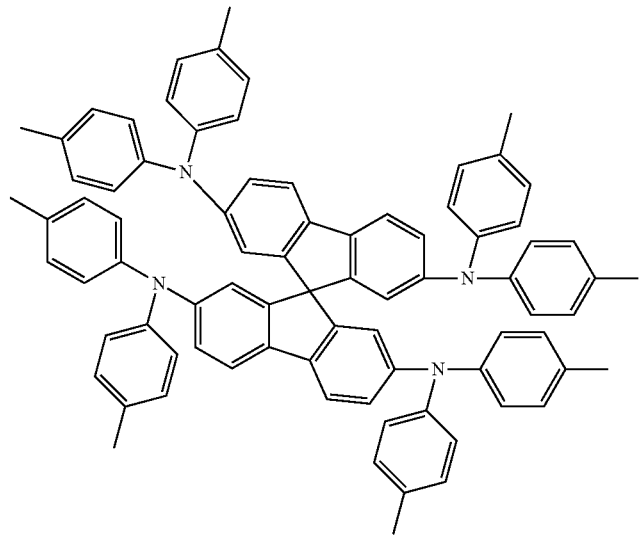
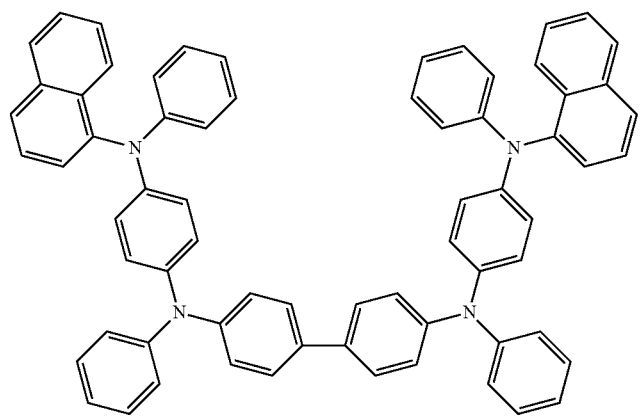 [SMILES: c1ccc(N(c2ccc(-c3ccc(N(c4ccccc4)c4ccc(N(c5ccccc5)c5cccc6ccccc56)cc4)cc3)cc2)c2ccc(N(c3ccccc3)c3cccc4ccccc34)cc2)cc1]
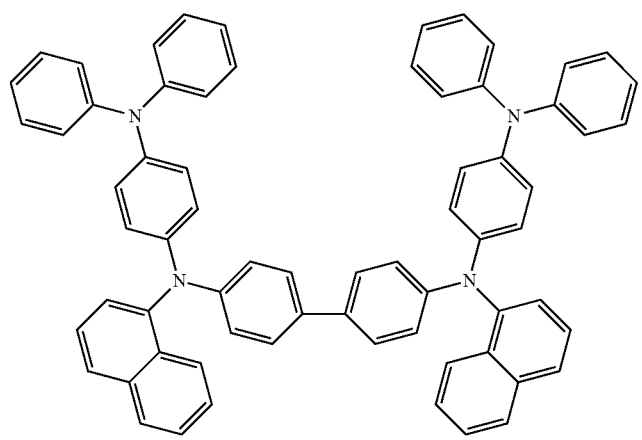 [SMILES: c1ccc(N(c2ccccc2)c2ccc(N(c3ccc(-c4ccc(N(c5ccc(N(c6ccccc6)c6ccccc6)cc5)c5cccc6ccccc56)cc4)cc3)c3cccc4ccccc34)cc2)cc1]

TABLE 3-continued
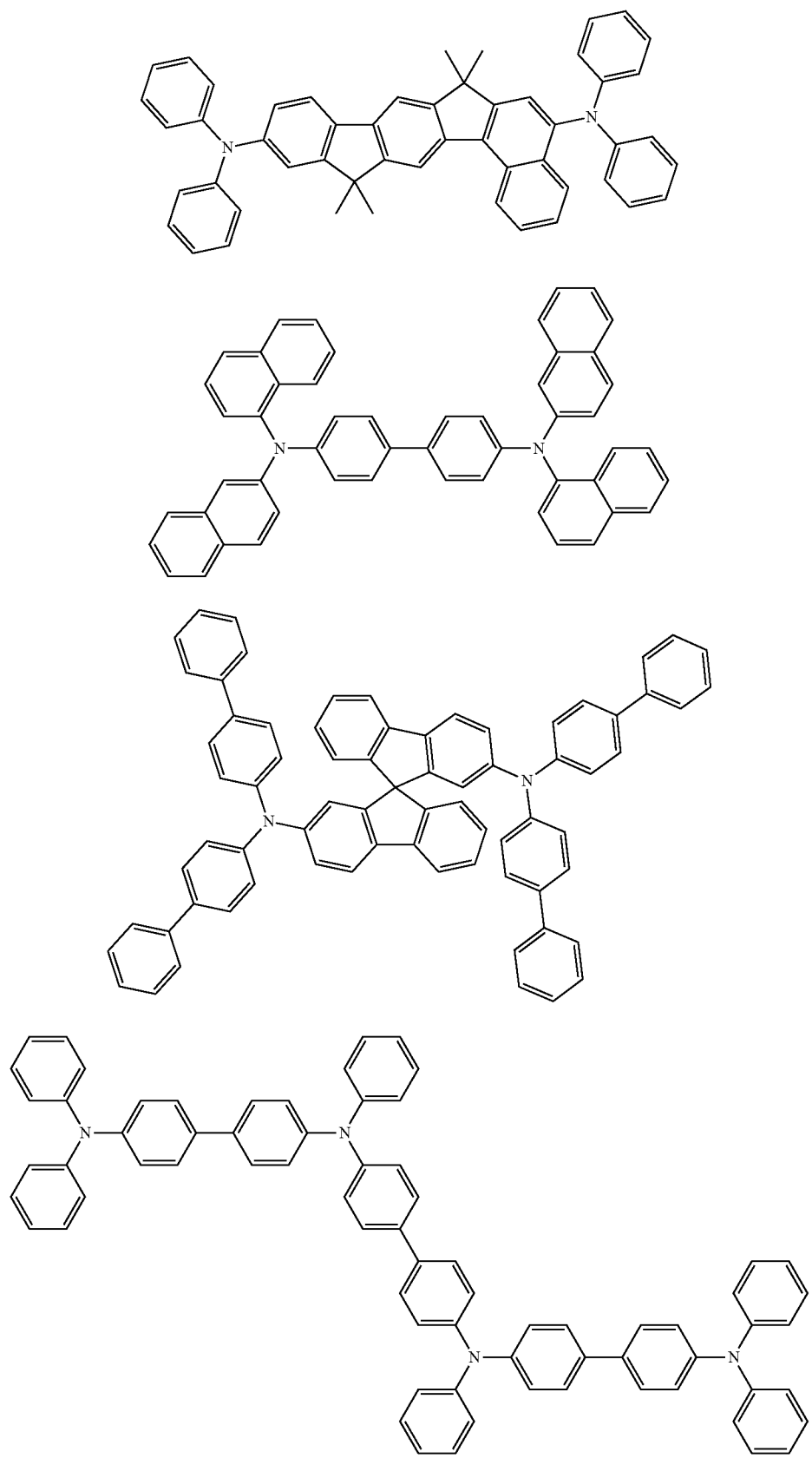

TABLE 3-continued
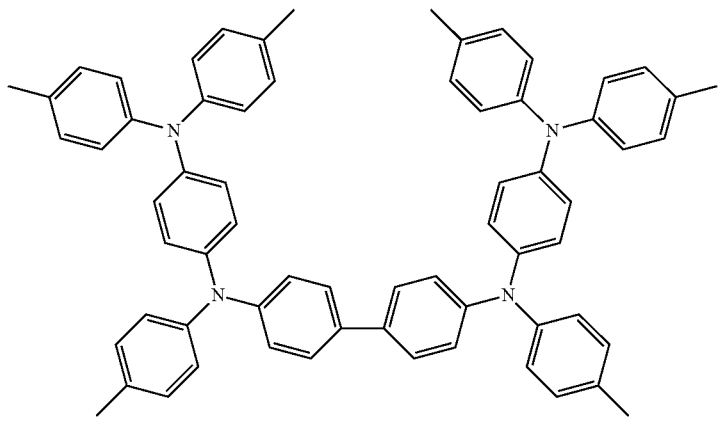
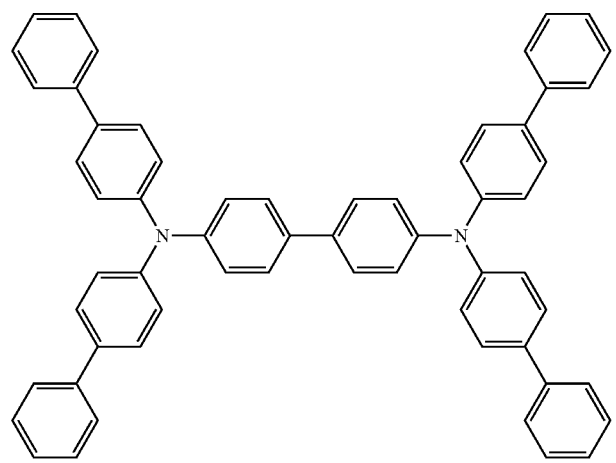 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1]
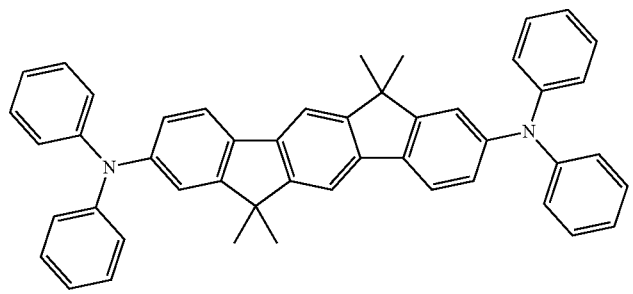 [SMILES: CC1(C)c2cc(N(c3ccccc3)c3ccccc3)ccc2-c2cc3c(cc21)-c1ccc(N(c2ccccc2)c2ccccc2)cc1C3(C)C]
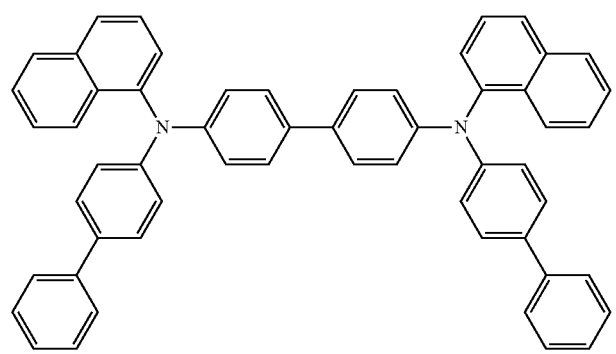 [SMILES: c1ccc(-c2ccc(N(c3ccc(-c4ccc(N(c5ccc(-c6ccccc6)cc5)c5cccc6ccccc56)cc4)cc3)c3cccc4ccccc34)cc2)cc1]

TABLE 3-continued

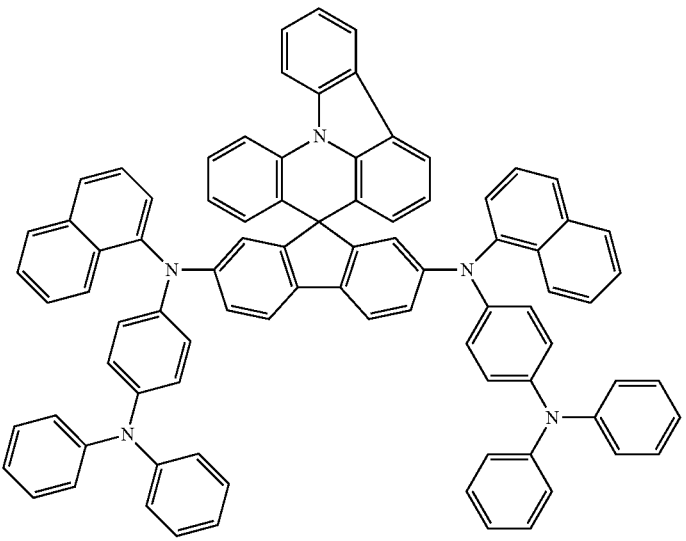 [SMILES: c1ccc(N(c2ccccc2)c2ccc(N(c3ccc4c(c3)C3(c5cc(N(c6ccc(N(c7ccccc7)c7ccccc7)cc6)c6cccc7ccccc67)ccc5-4)c4ccccc4-n4c5ccccc5c5cccc3c54)c3cccc4ccccc34)cc2)cc1]

Suitable electron-transport or electron-injection materials which can be used in the electroluminescent device according to the invention are, for example, the materials indicated in Table 4. Suitable electron-transport and electron-injection materials are furthermore derivatives of the compounds depicted above, as disclosed in JP 2000/053957, WO 03/060956, WO 04/028217 and WO 04/080975.

TABLE 4

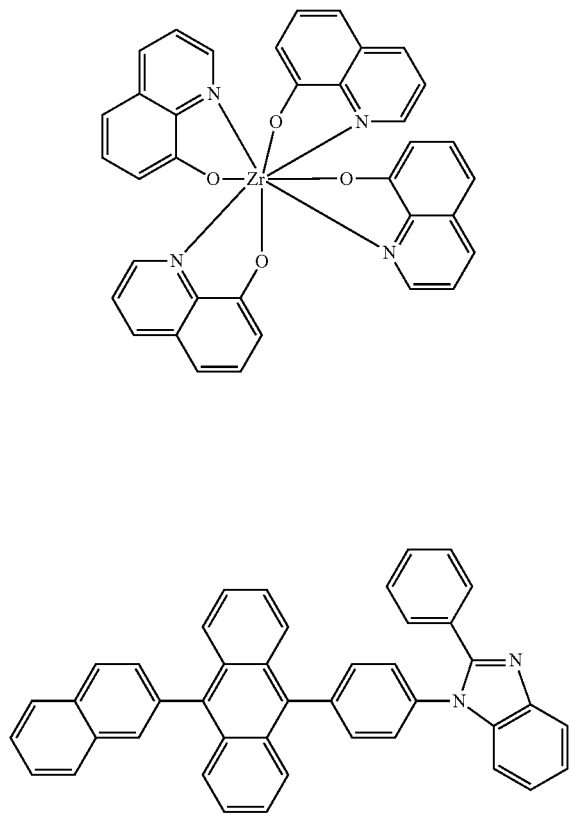

TABLE 4-continued

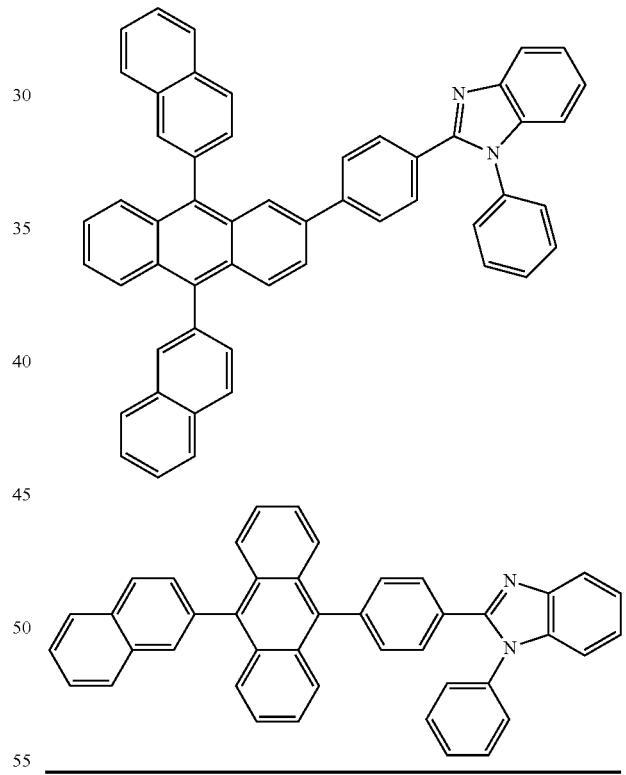

Suitable matrix materials for the compounds according to the invention are ketones, phosphine oxides, sulfoxides and sulfones, for example in accordance with WO 04/013080, WO 04/093207, WO 06/005627 or DE 102008033943, triarylamines, carbazole derivatives, for example CBP (N,N-biscarbazolylbiphenyl) or the carbazole derivatives as disclosed in WO 05/039246, US 2005/0069729, JP 2004/288381, EP 1205527 or WO 08/086851, indolocarbazole derivatives, for example in accordance with WO 07/063754 or WO 08/056746, azacarbazoles, for example in accordance with EP 1617710, EP 1617711, EP 1731584, JP 2005/347160, bipolar matrix materials, for example in accordance with WO 07/137725, silanes, for example in accordance with WO 05/111172, azaboroles or boronic esters, for example in accordance with WO 06/117052, triazine derivatives, for example in accordance with DE 102008036982, WO 07/063754 or WO 08/056746, or zinc complexes, for example in accordance with DE 102007053771.

With further preferences charge transport materials can be used having a triacene structure, such as anthracene and phenanthrene structures.

Triacene structure means a condensed aromatic hydrocarbon structure having exactly three condensed aromatic rings. Regarding this embodiment of the present invention, triacene structures do not include tetracene or pentacene structures.

The formulation of the present invention can comprise preferably 0.1 to 10% by weight, more preferably 0.25 to 5% and most preferably 0.5 to 4% by weight of low molecular weight organic semiconducting materials.

In a further preferred embodiment of the present invention, the organic semiconducting materials are selected from polymeric materials.

If the organic semiconducting material is a polymer it has a molecular weight $M_w$ of >5,000 g/mol, preferably at least 20,000 g/mol, more preferably at least 50,000 g/mol and most preferably at least 100,000 g/mol.

Surprising effects can be achieved with organic semiconducting compounds having a molecular weight $M_w$ in the range from 5,000 to 20,000,000 g/mol, preferably in the range from 20,000 to 10,000,000 g/mol, more preferably in the range from 50,000 to 5,000,000 g/mol and most preferably in the range from 100,000 to 2,000,000 g/mol. The molecular weight of the organic semiconducting material relates to the weight average. The weight average molecular weight $M_w$ can be measured by standard methods such as gel permeation chromatography (GPC) against polystyrene standards.

In the present application, the term "polymer" is taken to mean both polymeric compounds and dendrimers. The polymeric compounds according to the invention preferably have 10 to 10,000, more preferably 20 to 5,000 and in most preferably 50 to 2,000 structural units. The branching factor of the polymers here is between 0 (linear polymer, no branching sites) and 1 (fully branched dendrimer).

In a preferred embodiment of the present invention, the polymers useful for the invention may contain structural units as disclosed and listed extensively in WO 02/077060 A1, in WO 2005/014689 A2 and in WO 2010/136110 A2. These are incorporated into the present application by way of reference. The further structural units can originate, for example, from the following classes:

Group 1: Units which influence, preferably enhance, the hole-injection and/or hole-transport properties of the polymers;
Group 2: Units which influence, preferably enhance, the electron-injection and/or electron-transport properties of the polymers;
Group 3: Units which have combinations of individual units from group 1 and group 2;
Group 4; Units which modify the emission characteristics to such an extent that electrophosphorescence can be obtained instead of electrofluorescence;
Group 5: Units which improve transfer from the singlet state to the triplet state;
Group 6: Units which influence the emission colour of the resultant polymers;
Group 7: Units which are typically used as backbone;
Group 8; Units which influence the film-morphological and/or rheological properties of the resultant polymers.

Preferred polymers according to the invention are those in which at least one structural unit has charge-transport properties, i.e. which contain units from groups 1 and/or 2.

Structural units from group 1 which have hole-injection and/or hole-transport properties are, for example, triarylamine, benzidine, tetraaryl-para-phenylenediamine, triarylphosphine, phenothiazine, phenoxazine, dihydrophenazine, thianthrene, dibenzo-para-dioxin, phenoxathiyne, carbazole, azulene, thiophene, pyrrole and furan derivatives and further O-, S- or N-containing heterocycles having a high HOMO (HOMO=highest occupied molecular orbital). These arylamines and heterocycles preferably result in an HOMO in the polymer of greater than −5.8 eV (against vacuum level), particularly preferably greater than −5.5 eV.

Structural units from group 2 which have electron-injection and/or electron-transport properties are, for example, pyridine, pyrimidine, pyridazine, pyrazine, oxadiazole, quinoline, quinoxaline, anthracene, benzanthracene, pyrene, perylene, benzimidazole, triazine, ketone, phosphine oxide and phenazine derivatives, but also triarylboranes and further O-, S- or N-containing heterocycles having a low LUMO (LUMO=lowest unoccupied molecular orbital). These units in the polymer preferably result in an LUMO of less than −1.9 eV (against vacuum level), particularly preferably less than −2.5 eV.

It may be preferred for the polymers according to the present invention to contain units from group 3 in which structures which increase the hole mobility and structures which increase the electron mobility (i.e. units from groups 1 and 2) are bonded directly to one another or structures which increase both the hole mobility and the electron mobility. Some of these units can serve as emitters and shift the emission colour into the green, yellow or red. Their use is thus suitable, for example, for the generation of other emission colours from originally blue-emitting polymers.

Structural units from group 4, so-called triplet emitter units, are those which are able to emit light from the triplet state with high efficiency, even at room temperature, i.e. exhibit electrophosphorescence instead of electrofluorescence, which frequently causes an increase in the energy efficiency. For the purposes of the present application, a triplet emitter unit is taken to mean a compound which comprises a triplet emitter. For the purposes of the present application, triplet emitters are taken to mean all compounds which are capable of emitting light in the visible or NIR region through transfer from a triplet state into an energetically lower state. This is also referred to as phosphorescence. Suitable for this purpose are firstly compounds which contain heavy atoms having an atomic number of greater than 36. Preference is given to compounds which contain d- or f-transition metals which satisfy the above-mentioned condition. Particular preference is given here to corresponding structural units which contain elements from groups 8 to 10 (Ru, Os, Rh, Ir, Pd, Pt). Suitable structural units for the polymers according to the invention here are, for example, various complexes, as described, for example, in WO 02/068435 A1, WO 02/081488 A1 and EP 1239526 A2. Corresponding monomers are described in WO 02/068435 A1 and in WO 2005/042548 A1.

It is preferred in accordance with the present invention to employ triplet emitters which emit in the visible spectral region (red, green or blue).

The triplet emitter may be part of the backbone of the polymer (i.e. in the main chain of the polymer) or it may be located in the side chain of the polymer.

Structural units from group 5 are those which improve transfer from the singlet state to the triplet state and which, employed in support of the above-mentioned triplet emitter units, improve the phosphorescence properties of these structural elements. Suitable for this purpose are, in particular, carbazole and bridged carbazole dimer units, as described, for example, in WO 2004/070772 A2 and WO 2004/113468 A1. Also suitable for this purpose are ketones, phosphine oxides, sulfoxides, sulfones, silane derivatives and similar compounds, as described, for example, in WO 2005/040302 A1.

Structural units from group 6, are those which have at least one further aromatic structure or another conjugated structure which do not fall under the above-mentioned groups, i.e. which have only little influence on the charge-carrier mobilities, are not organometallic complexes or do not influence singlet-triplet transfer. Structural elements of this type can influence the emission colour of the resultant polymers. Depending on the unit, they can therefore also be employed as emitters. Preference is given here to aromatic structures having 6 to 40 C atoms and also tolan, stilbene or bisstyrylarylene derivatives, each of which may be substituted by one or more radicals. Particular preference is given here to the incorporation of 1,4-phenylene, 1,4-naphthylene, 1,4- or 9,10-anthrylene, 1,6-, 2,7- or 4,9-pyrenylene, 3,9- or 3,10-perylenylene, 4,4'-biphenylylene, 4,4''-terphenylylene, 4,4'-bi-1,1'-naphthylylene, 4,4'-tolanylene, 4,4'-stilbenylene, 4,4''-bisstyrylarylene, benzothiadiazole and corresponding oxygen derivatives, quinoxaline, phenothiazine, phenoxazine, dihydrophenazine, bis(thiophenyl)arylene, oligo(thiophenylene), phenazine, rubrene, pentacene or perylene derivatives, which are preferably substituted, or preferably conjugated push-pull systems (systems which are substituted by donor and acceptor substituents) or systems such as squarines or quinacridones, which are preferably substituted.

Structural units from group 7 are units which contain aromatic structures having 6 to 40 C atoms, which are typically used as polymer backbone. These are, for example, 4,5-dihydropyrene derivatives, 4,5,9,10-tetrahydro-pyrene derivatives, fluorene derivatives, 9,9'-spirobifluorene derivatives, phenanthrene derivatives, 9,10-dihydrophenanthrene derivatives, 5,7-dihydrodibenzoxepine derivatives and cis- and trans-indenofluorene derivatives, but in principle also all similar structures which, after polymerisation, would result in a conjugated, bridged or unbridged polyphenylene or polyphenylene-vinylene homopolymer. Here too, the said aromatic structure may contain heteroatoms, such as O, S or N, in the backbone or the side chain.

Structural units from group 8 are those which influence the film-morphological properties and/or the rheological properties of the polymers, such as, for example, siloxanes, long alkyl chains or fluorinated groups, but also particularly rigid or flexible units, such as, for example, liquid crystal-forming units or crosslinkable groups.

The synthesis of the above-described units from groups 1 to 8 and of the further emitting units is known to the person skilled in the art and is described in the literature, for example in WO 2005/014689 A2, WO 2005/030827 A1, WO 2005/030828 A1 and WO 2010/136110 A2. These documents and the literature cited therein are incorporated into the present application by way of reference.

The polymers useful for the present invention may contain one or more units selected from groups 1 to 8. It may furthermore be preferred for more than one structural unit from one group to be present simultaneously.

The way in which white-emitting copolymers can be synthesised is described in detail, for example, in WO 2005/030827 A1, WO 2005/030828 A1 and WO 2010/136110 A2.

Astonishing improvements can be achieved with one or more polymeric organic semiconducting materials having a high solubility. Preferred polymeric organic semiconducting materials can comprise Hansen Solubility parameters of $H_d$ in the range of 17.0 to 20.0 $MPa^{0.5}$, $H_p$ in the range of 2 to 10.0 $MPa^{0.5}$ and $H_h$ in the range of 0.0 to 15.0 $MPa^{0.5}$. More preferred organic semiconducting materials comprise Hansen Solubility parameters of $H_d$ in the range of 17.5 to 19.0 $MPa^{0.5}$, $H_p$ in the range of 3.5 to 8.0 $MPa^{0.5}$ and $H_h$ in the range of 3.0 to 10.0 $MPa^{0.5}$.

Surprising effects can be achieved with organic semiconducting materials having a radius of at least 3.0 $MPa^{0.5}$, preferably at least 4.5 $MPa^{0.5}$ and more preferably at least 5.0 $MPa^{0.5}$ determined according to Hansen Solubility parameters.

The Hansen Solubility Parameters can be determined according to the Hansen Solubility Parameters in Practice HSPiP $3^{rd}$ edition, (Software version 3.0.38) with reference to the Hansen Solubility Parameters: A User's Handbook, Second Edition, C. M. Hansen (2007), Taylor and Francis Group, LLC) as supplied by Hanson and Abbot et al.

The positions $H_d$, $H_p$ and $H_h$ are the coordinates in 3 dimensional space for the centre of the organic semiconducting compound, whilst the radius, gives the distance that the solubility extends, i.e. if the radius is large it will encompass more solvents that would dissolve the material and conversely if it was small then a restricted number of solvents would solubilise the organic semiconducting material.

According to a special aspect of the present invention the organic semiconducting material may comprise a high glass transition temperature. Preferably, the organic semiconducting material may have a glass transition temperature preferably of at least 70° C., more preferably of at least 100° C. and most preferably of at least 125° C. determined according to DIN 51005.

According to a special embodiment of the present invention, the organic semiconducting compound (OSC) can be used for example as the active channel material in the semiconducting channel of an OFET, or as a layer element of an organic rectifying diode.

In case of OFET devices, where the OFET layer contains an OSC as the active channel material, it may be an n- or p-type OSC. The semiconducting channel may also be a composite of two or more OSC compounds of the same type, i.e. either n- or p-type. Furthermore, a p-type channel OSC compound may for example be mixed with an n-type OSC compound for the effect of doping the OSC layer. Multilayer semiconductors may also be used. For example, the OSC may be intrinsic near the insulator interface and a highly doped region can additionally be coated next to the intrinsic layer.

Preferred organic semiconducting compounds have a FET charge carrier mobility of greater than $1\times10^{-5}$ $cm^2V^{-1}s^{-1}$, more preferably greater than $1\times10^{-2}$ $cm^2V^{-1}s^{-1}$.

The organic light emitting materials and charge transporting materials can be selected from standard materials known to the skilled person and described in the literature. Organic light emitting material according to the present application means a material which emits light having a $\lambda_{max}$ in the range from 400 to 700 nm.

According to a special embodiment of the present invention, the composition preferably comprises 0.1 to 10% by weight, more preferably 0.25 to 5% and most preferably 0.5 to 4% by weight of organic semiconducting materials having a molecular weight of at least 10,000 g/mol, preferably emitting materials and/or charge transporting materials.

It may additionally be preferred to use the organic semiconducting compounds (OSC) having a molecular weight of at least 10,000 g/mol not as the pure substance, but instead as a mixture together with further polymeric, oligomeric, dendritic or low-molecular-weight substances of any desired type. These may, for example, improve the electronic properties or themselves emit. Above and below, a mixture is taken to mean a composition which comprises at least one polymeric component or film forming small molecule component.

The formulation of the present invention comprises one or more organic solvents. Consequently, the formulation of the present invention contains a single solvent or a mixture of two, three or more organic solvents.

In a preferred embodiment, at least one solvent of the formulation has a boiling point of ≥90° C., preferably of a ≥150° C. and more preferably ≥200° C.

If the formulation of the present invention contains at least two different solvents, the difference of the boiling points of two solvents of the at least two different solvents is ≥10° C.

If the formulation of the present invention contains at least two different solvents, the difference of the vapour pressure of two solvents of the at least two solvents is ≥ a factor of 2, preferably ≥a factor of 10.

The formulation of the present invention comprises one or more organic solvents, preferably at least one aromatic solvent. The solvents are preferably selected from the group consisting of aromatic hydrocarbons, like toluene, o-, m- or p-xylene, trimethyl benzenes (e.g. 1,2,3-, 1,2,4- and 1,3,5-trimethyl benzenes), tetralin, other mono-, di-, tri- and tetraalkyl-benzenes (e.g. diethylbenzenes, methylcumene, tetramethylbenzenes etc), aromatic ethers (e.g. anisole, alkyl anisoles, e.g. 2, 3 and 4 isomers of methylanisole, 2,3-, 2,4-, 2,5-, 2,6-, 3,4- and 3,5-isomers of dimethylanisole), naphthalene derivatives, alkylnaphthalene derivatives (e.g. 1- and 2-methylnaphthalene), di- and tetrahydronaphthalene derivatives. Also preferred are aromatic esters (e.g alkyl benzoates), aromatic ketones (e.g. acetophenone, propiophenone), alkyl ketones (e.g. cyclohexanone), heteroaromatic solvents (e.g. thiophene, mono-, di- and trialkyl thiophenes, 2-alkylthiazoles, benzthiazoles etc, pyridines), halogenarylenes and anilin derivatives. These solvents may comprise halogen atoms.

Especially preferred are: 3-fluoro-trifluoromethylbenzene, trifluoromethylbenzene, dioxane, trifluoromethoxybenzene, 4-fluoro-benzenetrifluoride, 3-fluoropyridine, toluene, 3-phenoxytoluene, 2-fluorotoluene, 2-fluorobenzenetrifluoride, 3-fluorotoluene, pyridine, 4-fluorotoluene, 2,5-difluorotoluene, 1-chloro-2,4-difluorobenzene, 2-fluoropyridine, 3-chlorofluorobenzene, 1-chloro-2,5-difluorobenzene, 4-chlorofluorobenzene, chlorobenzene, 2-chlorofluoro-benzene, p-xylene, m-xylene, o-xylene, 2,6-lutidine, 2-fluoro-m-xylene, 3-fluoro-o-xylene, 2-chlorobenzene-trifluoride, dimethylformamide, 2-chloro-6-fluorotoluene, 2-fluoroanisole, anisole, 2,3-dimethylpyrazine, bromobenzene, 4-fluoroanisole, 3-fluoroanisole, 3-trifluoromethylanisole, 2-methylanisole, phenetol, benzenedioxol, 4-methylanisole, 3-methylanisole, 4-fluoro-3-methylanisole, 1,2-dichloro-benzene, 2-fluorobenzenenitril, 4-fluoroveratrol, 2,6-dimethylanisole, aniline, 3-fluorobenzenenitril, 2,5-dimethylanisole, 3,4-dimethylanisole, 2,4-dimethylanisole, benzenenitril, 3,5-dimethylanisole, N,N-dimethylaniline, 1-fluoro-3,5-dimethoxybenzene, phenylacetate, N-methylaniline, methyl-benzoate, N-methylpyrrolidone, morpholine, 1,2-dihydronaphthalene, 1,2,3,4-tetrahydronaphthalene, o-tolunitril, veratrol, ethylbenzoate, N,N-diethylaniline, propylbenzoate, diethyleneglycol butyl methyl ether, 1-methylnaphthalene, butylbenzoate, 2-methylbiphenyl, 2-phenylpyridine or 2,2'-Bi-tolyl.

More preferred are aromatic hydrocarbons especially toluene, dimethyl-benzenes (xylenes), trimethyl benzenes, tetralin and methylnaphthalenes, aromatic ethers, especially anisole and aromatic esters, especially methyl benzoate.

Most preferred are aromatic ethers, especially anisole and derivates thereof, such as alkyl anisoles, and aromatic esters, especially methyl-benzoate.

These solvents can be used as a single solvent or as a mixture of two, three or more.

Preferred organic solvents can comprise Hansen Solubility parameters of $H_d$ in the range of 17.0 to 23.2 $MPa^{0.5}$, $H_p$ in the range of 0.2 to 12.5 $MPa^{0.5}$ and $H_h$ in the range of 0.9 to 14.2 $MPa^{0.5}$ as shown in Table 5. More preferred organic solvents comprise Hansen Solubility parameters of $H_d$ in the range of 18.5 to 21.0 $MPa^{0.5}$, $H_p$ in the range of 2.0 to 6.0 $MPa^{0.5}$ and $H_h$ in the range of 2.0 to 6.0 $MPa^{0.5}$.

TABLE 5

Hansen Solubility Parameters of useful solvents

| Solvent | $H_d$ [$MPa^{0.5}$] | $H_h$ [$MPa^{0.5}$] | $H_p$ [$MPa^{0.5}$] |
|---|---|---|---|
| 1,2,3,4-tetrahydro-1-naphthol | 19.6 | 9.2 | 12.8 |
| 1,2,3,4-tetrahydronaphthalene | 19.1 | 2.3 | 4.0 |
| 1,2,3,4-tetramethylbenzene | 18.7 | 1.8 | 1.6 |
| 1,2,3,5-tetramethylbenzene | 18.7 | 1.8 | 1.6 |
| 1,2,3-trimethylbenzene | 19.0 | 2.9 | 1.6 |
| 1,2,4,5-tetramethylbenzene | 18.7 | 1.8 | 1.6 |
| 1,2,4-trichlorobenzene | 20.5 | 6.9 | 2.7 |
| 1,2,4-trimethylbenzene | 19.0 | 2.9 | 1.6 |
| 1,2-dihydronaphthalene | 20.1 | 5.5 | 4.9 |
| 1,2-dimethylnaphthalene | 21.0 | 1.7 | 5.2 |
| 1,3,3-trimethyl-2-methyleneindole | 17.9 | 1.0 | 3.0 |
| 1,3-benzodioxole | 19.7 | 7.4 | 7.9 |
| 1,3-diisopropylbenzene | 17.5 | 0.2 | 1.1 |
| 1,3-dimethylnaphthalene | 21.0 | 1.7 | 5.2 |
| 1,4-benzodioxane | 19.5 | 8.7 | 7.2 |
| 1,4-diisopropylbenzene | 17.5 | 0.6 | 1.6 |
| 1,4-dimethylnaphthalene | 21.0 | 1.7 | 5.2 |
| 1,5-dimethyltetralin | 19.3 | 5.5 | 2.6 |
| 1-benzothiophene | 19.7 | 12.3 | 6.3 |
| 1-bromonaphthalene | 23.1 | 10.3 | 6.1 |
| 1-chloromethyl naphthalene | 22.1 | 9.9 | 5.3 |
| 1-ethylnaphthalene | 20.7 | 7.8 | 4.4 |
| 1-methoxynaphthalene | 21.4 | 10.5 | 7.5 |
| 1-methylnaphthalene | 21.7 | 8.4 | 4.5 |
| 1-methylindane | 19.4 | 5.7 | 2.5 |
| 1-methylindole | 19.2 | 8.1 | 10.2 |
| 2,3,3-trimethoxyindolenine | 19.6 | 6.8 | 4.2 |
| 2,3-benzofuran | 21.3 | 5.5 | 5.6 |
| 2,3-dihydrobenzofuran | 19.9 | 9.5 | 6.6 |
| 2,3-dimethylanisol | 18.9 | 4.6 | 4.5 |
| 2,4-dimethylanisol | 18.9 | 4.6 | 4.5 |
| 2,5-dimethylanisol | 18.9 | 4.6 | 4.5 |
| 2,6-diisopropyl naphthalene | 18.3 | 3.5 | 2.2 |
| 2,6-dimethylanisol | 18.9 | 4.6 | 4.5 |
| 2,6-dimethylnaphthalene | 20.1 | 5.0 | 3.0 |
| 2-bromo-3-bromomethyl)thiophene | 19.3 | 7.3 | 6.6 |
| 2-bromomethyl naphthalene | 22.0 | 9.4 | 7.2 |
| 2-bromonaphthalene | 23.1 | 10.3 | 6.1 |
| 2-ethoxynaphthalene | 20.5 | 10.0 | 7.0 |
| 2-ethylnaphthalene | 20.7 | 7.8 | 4.4 |
| 2-isopropylanisol | 17.7 | 4.3 | 5.4 |

TABLE 5-continued

Hansen Solubility Parameters of useful solvents

| Solvent | $H_d$ [MPa$^{0.5}$] | $H_h$ [MPa$^{0.5}$] | $H_p$ [MPa$^{0.5}$] |
|---|---|---|---|
| 2-methyl quinoline | 20.0 | 7.8 | 4.0 |
| 2-methylanisol | 18.3 | 5.1 | 6.2 |
| 2-methylindole | 17.8 | 9.7 | 4.8 |
| 2-phenoxyethanol | 18.7 | 8.5 | 13.0 |
| 3-phenoxytoluene | 19.7 | 4.1 | 4.2 |
| 3,4-dimethylanisol | 18.9 | 4.6 | 4.5 |
| 3,5-dimethylanisol | 18.9 | 4.6 | 4.5 |
| 3-bromoquinoline | 21.4 | 8.7 | 5.1 |
| 3-isopropylbiphenyl | 19.1 | 1.3 | 1.9 |
| 3-methylanisol | 18.7 | 5.7 | 5.4 |
| 4-benzylacetone | 18.3 | 8.8 | 5.0 |
| 4-isopropylbiphenyl | 19.0 | 2.5 | 1.9 |
| 4-methoxybenzyl alcohol | 19.0 | 8.5 | 13.3 |
| 4-methylanisol | 18.6 | 5.9 | 7.2 |
| 4-phenyl-2-butanone | 18.3 | 8.8 | 5.0 |
| 5,6,7,8-tetrahydro-1-naphthol | 19.6 | 7.2 | 10.9 |
| 5,6,7,8-tetrahydro-2-naphthol | 19.6 | 7.2 | 10.9 |
| 5,6,7,8-tetrahydro-2-naphthylamine | 20.1 | 7.9 | 8.6 |
| 5,6,7,8-tetrahydro-1-naphthylamine | 20.1 | 7.9 | 8.6 |
| 5-decanolide | 17.1 | 7.8 | 3.8 |
| 5-methoxyindan | 19.8 | 9.8 | 4.0 |
| 5-methoxyindole | 17.4 | 12.3 | 7.8 |
| 5-tert-butyl-m-xylene | 17.6 | 3.4 | 2.2 |
| 6-methoxy-1,2,3,4-tetrahydronapthalene | 19.4 | 6.8 | 5.4 |
| 6-methyl quinoline | 21.7 | 8.4 | 4.5 |
| 8-methyl quinoline | 21.7 | 8.4 | 4.5 |
| Acetophenone | 18.8 | 10.8 | 5.5 |
| Anisole | 18.5 | 5.5 | 5.2 |
| α-pinene | 17.4 | 3.0 | 3.2 |
| Benzonitrile | 19.2 | 11.9 | 4.7 |
| Benzothiazole | 21.3 | 5.5 | 5.6 |
| benzyl acetate | 18.2 | 7.3 | 6.4 |
| benzyl alcohol | 19.1 | 6.7 | 14.2 |
| Bromobenzene | 19.8 | 7.6 | 4.3 |
| Butylbenzene | 17.6 | 2.6 | 1.7 |
| Butylbenzoate | 17.7 | 5.9 | 5.2 |
| Cyclohexylbenzene | 18.6 | 1.0 | 1.6 |
| Decahydronaphthalene | 17.5 | 0.4 | 1.0 |
| diphenyl ether | 19.9 | 2.9 | 3.3 |
| diethyleneglycol butyl methyl ether | 15.8 | 6.1 | 5.0 |
| ethylphenylketon (propiophenone) | 18.3 | 8.9 | 5.3 |
| Ethylbenzene | 18.2 | 2.7 | 2.1 |
| Ethylbenzoate | 18.1 | 6.6 | 5.9 |
| furfuryl alcohol | 18.1 | 6.7 | 11.9 |
| gamma-terpinene | 18.0 | 2.5 | 2.8 |
| Hexylbenzene | 17.4 | 2.9 | 1.6 |
| Indane | 19.7 | 7.3 | 5.8 |
| Indene | 20.3 | 4.4 | 5.4 |
| iso-amylbenzene | 17.1 | 3.7 | 1.8 |
| iso-butylbenzene | 17.1 | 2.9 | 1.6 |
| isopropylbenzene (cumene) | 17.8 | 2.0 | 1.1 |
| m-cymene | 18.1 | 2.0 | 2.1 |
| Mesitylene | 19.0 | 2.9 | 1.6 |
| methyl benzoate | 18.5 | 7.9 | 6.4 |
| Methylphenylacetate | 18.2 | 7.3 | 6.4 |
| m-xylene | 18.8 | 3.1 | 2.7 |
| n-butoxybenzene | 17.5 | 4.4 | 4.1 |
| n-butylbenzene | 17.6 | 2.6 | 1.7 |
| n-propyl benzoate | 17.8 | 6.6 | 6.3 |
| n-propylbenzene | 17.8 | 3.4 | 2.8 |
| o-dichlorobenzene | 19.5 | 8.7 | 3.3 |
| o-diethylbenzenes | 17.7 | 0.7 | 1.9 |
| o-ethyltoluene | 18.0 | 1.9 | 2.8 |
| o-xylene | 18.4 | 2.0 | 2.9 |
| Pentylbenzene | 17.4 | 3.0 | 1.8 |
| p-ethyltoluene | 18.3 | 3.5 | 2.8 |
| Phenetol | 18.1 | 4.6 | 4.6 |
| Phenyl acetate | 18.5 | 7.9 | 6.4 |
| p-isopropyltoluene (p-cymene) | 18.0 | 2.5 | 2.8 |
| Propiophenone | 18.3 | 8.9 | 5.3 |
| Propylbenzoate | 17.8 | 6.6 | 6.3 |
| p-xylene | 18.7 | 3.3 | 3.3 |
| sec-butylbenzene | 17.2 | 2.2 | 1.6 |
| t-butylbenzene | 17.2 | 1.3 | 2.9 |
| Tetralin | 19.1 | 2.3 | 4.0 |
| Thiophene | 18.8 | 5.2 | 7.4 |
| Toluene | 18.6 | 4.0 | 2.2 |
| Veratrole | 18.2 | 6.3 | 7.5 |

$H_d$ refers to Dispersion contribution
$H_p$ refers to Polar contribution
$H_h$ refers to Hydrogen bonding contribution Preferably the solvent has a boiling point or sublimation temperature of <300° C. at the pressure employed, very preferably at atmospheric pressure (1013 hPa). Evaporation can also be accelerated e.g. by applying heat and/or reduced pressure.

Usually, the organic solvent can comprise a surface tension of at least 28 mN/m, preferably at least 30 mN/m, more preferably at least 32 mN/m and most preferably at least 35 mN/m. The surface tension can be measured using a FTA (First Ten Angstrom) 125 contact angle goniometer at 25° C. Details of the method are available from First Ten Angstrom as published by Roger P. Woodward, Ph.D. "Surface Tension Measurements Using the Drop Shape Method". Preferably, the pendant drop method can be used to determine the surface tension.

For the purpose for making a rough estimate, the surface tension can be calculated using the Hansen Solubility Parameters by the formula expounded in Hansen Solubility Parameters: A User's Handbook, Second Edition, C. M. Hansen (2007), Taylor and Francis Group, LLC (HSPiP manual).

$$\text{Surface tension} = 0.0146 \times (2.28 \times {}^\delta H_d^2 + {}^\delta H_p^2 + {}^\delta H_h^2) \times \text{MVol}^2, \text{ where;}$$

$H_d$ refers to Dispersion contribution
$H_p$ refers to Polar contribution
$H_h$ refers to Hydrogen bonding contribution
MVol refers to Molar Volume.

The Hansen Solubility Parameters can be determined according to the Hansen Solubility Parameters in Practice (HSPiP) program ($2^{nd}$ edition) as supplied by Hanson and Abbot et al.

Preferably, the solvent can comprise a relative evaporation rate (Butyl acetate=100) of at least 0.01, preferably of at least 0.1, preferably of at least 0.5, more preferably of at least 5, more preferably of at least 10 and most preferably of at least 20. The relative evaporation rate can be determined according to DIN 53170: 2009-08. For the purpose for making a rough estimate, the relative evaporation rate can be calculated using the Hansen Solubility Parameters with the HSPiP program as mentioned above and below.

The formulation of the present invention comprises preferably at least 70% by weight, more preferably at least 80% by weight and most preferably at least 90% by weight of one or more organic solvents.

To further modify the properties of the formulation of the present invention, it can contain additives and/or auxiliaries. In one embodiment, the formulation of the present invention contains as an additive at least one polymeric material as an inert binder. This means, that the polymer does not have semiconducting properties or chemically reacts with any of the semiconducting compounds in the composition. The low conducting properties of the inert polymeric binder can be determined as low permittivity. Preferred binders according to the present invention are materials of low permittivity, that is, those having a permittivity (ε) at 1,000 Hz of 3.3 or less. The organic binder preferably has a permittivity at 1,000 Hz of less than 3.0, more preferably 2.9 or less. Preferably the organic binder has a permittivity at 1,000 Hz of greater than 1.7. It is especially preferred that the permittivity of the binder is in the range from 2.0 to 2.9. The term "chemically react" as used above and below refers to a possible oxidation or other chemical reaction of the non-conductive additive with the organic light emitting materials and/or charge transport materials under the conditions used for manufacture, storage, transport and/or use of the formulation, the OLED device, OTFT device, OFET device, solar cell, sensor, organic diode and RFID device.

Preferably, the polymeric binder comprises a weight average molecular weight in the range of 1,000 to 50,000,000 g/mol, more preferably 1,500 to 10,000,000 g/mol and most preferable 2,000 to 5,000,000 g/mol. Surprising effects can be achieved with polymers having a weight average molecular weight of preferably ≥10,000 g/mol, more preferably ≥100,000 g/mol.

In particular, the polymer can have a polydispersity index $M_w/M_n$ in the range of 1.0 to 10.0, more preferably in the range of 1.1 to 5.0 and most preferably in the range of 1.2 to 3.

Usually, the polymeric binder is dispersible or soluble in the solvent of the present composition as described above and below. Preferably, the polymeric binder is soluble in the organic solvent and the solubility of the polymeric binder in the solvent is at least 1 g/l, more preferably at least 5 WI and most preferably at least 10 g/l.

According to a special embodiment of the present invention, the composition can comprise preferably 0.1 to 10% by weight, more preferably 0.25 to 5% and most preferably 0.5 to 4% by weight polymeric binder.

According to a special embodiment the polymeric binders preferably comprise repeating units derived from styrene and/or olefins. Preferred polymeric binders can comprise at least 80%, preferably 90% and more preferably 99% by weight of repeating units derived from styrene monomers and/or olefins.

Styrene monomers are well known in the art. These monomers include styrene, substituted styrenes with an alkyl substituent in the side chain, such as α-methylstyrene and α-ethylstyrene, substituted styrenes with an alkyl substituent on the ring such as vinyltoluene and p-methylstyrene, halogenated styrenes such as monochlorostyrenes, dichlorostyrenes, tribromostyrenes and tetrabromostyrenes.

Olefins are monomers consisting of hydrogen and carbon atoms. These monomers include ethylene, propylene, butylenes, isoprene and 1,3-butadiene.

According to a special aspect of the present invention, the polymeric binder is polystyrene having a weight average molecular weight in the range of 50,000 to 2,000,000 g/mol, preferably 100,000 to 750,000 g/mol, more preferably in the range of 150,000 to 600,000 g/mol and most preferably in the range of 200,000 to 500,000 g/mol.

According to a further embodiment of the present invention, the polymeric binder is poly-4-methylstyrene having a weight average molecular weight in the range of 40,000 to 120,000 g/mol, more preferably in the range of 60,000 to 100,000 g/mol.

Especially, the binder can be poly-α-methyl styrene having a weight average molecular weight in the range of 1,000 to 20,000 g/mol, more preferably in the range of 1,500 to 6,000 g/mol.

Useful and preferred polymeric binders comprise Hansen Solubility parameters of $H_d$ in the range of 15.7 to 23.0 MPa$^{0.5}$, $H_p$ in the range of 0.0 to 20.0 MPa$^{0.5}$ and $H_h$ in the range of 0.0 to 12.5 MPa$^{0.5}$. More preferred polymeric binders comprise Hansen Solubility parameters of $H_d$ in the range of 17.0 to 21.0 MPa$^{0.5}$, $H_p$ in the range of 1.0 to 5.0 MPa$^{0.5}$ and $H_h$ in the range of 2.0 to 10.0 MPa$^{0.5}$. Most preferred polymeric binders comprise Hansen Solubility parameters of $H_d$ in the range of 19.0 to 21.0 MPa$^{0.5}$, $H_p$ in the range of 1.0 to 3.0 MPa$^{0.5}$ and $H_h$ in the range of 2.5 to 5.0 MPa$^{0.5}$.

The Hansen Solubility Parameters can be determined according to the Hansen Solubility Parameters in Practice (HSPiP) program (2$^{nd}$ edition) as supplied by Hanson and Abbot et al.

Examples of useful polymeric binders are disclosed in Table 1 of WO 2011/076325 A1.

According to a preferred embodiment of the present invention, the inert binder is a polymer having a glass transition temperature in the range of −70 to 160° C., preferably 0 to 150° C., more preferably 50 to 140° C. and most preferably 70 to 130° C. The glass transition temperature can be determined by measuring the DSC of the polymer (DIN EN ISO 11357, heating rate 10° C. per minute).

The formulation according to the present invention may additionally comprise one or more further components like for example surface-active compounds, lubricating agents, wetting agents, dispersing agents, hydrophobing agents, adhesive agents, flow improvers, defoaming agents, deaerators, diluents which may be reactive or non-reactive, auxiliaries, colourants, dyes, sensitizers, stabilizers, or inhibitors.

Surprising improvements can be achieved with volatile wetting agents. The term "volatile" as used above and below means that the agent can be removed from the organic semiconducting material(s) by evaporation, after these material(s) have been deposited onto a substrate of an OLED device, OTFT device, OFET device, solar cell, sensor, organic diode or RFID device, under conditions (like temperature and/or reduced pressure) that do not significantly damage these materials or the device. Preferably this means that the wetting agent has a boiling point or sublimation temperature of <350° C., more preferably ≤300° C., most preferably ≤250° C., at the pressure employed, very preferably at atmospheric pressure (1013 hPa). Evaporation can also be accelerated e.g. by applying heat and/or reduced pressure.

Surprising effects can be accomplished by compositions comprising volatile components having similar boiling points. Preferably, the difference of the boiling point of the wetting agent and the organic solvent is in the range of −50° C. to 50° C., more preferably in the range of −30° C. to 30° C. and most preferably in the range of −20° C. to 20° C.

Preferred wetting agents are non-aromatic compounds. With further preference the wetting agents are non-ionic compounds. Particular useful wetting agents comprise a surface tension of at most 35 mN/m, preferably of at most 30 mN/m, and more preferably of at most 25 mN/m. The surface tension can be measured using a FTA (First Ten Angstrom) 125 contact angle goniometer at 25° C. Details of the method are available from First Ten Angstrom as published by Roger P. Woodward, Ph.D. "Surface Tension Measurements Using the Drop Shape Method". Preferably, the pendant drop method can be used to determine the surface tension.

According to a special aspect of the present invention, the difference of the surface tension of the organic solvent and the wetting agent is preferably at least 1 mN/m, preferably at least 5 mN/m and more preferably at least 10 mN/m.

According to a special aspect of the present invention the wetting additive can comprise a relative evaporation rate (Butyl acetate=100) of at least 0.01, preferably of at least 0.1, preferably of at least 0.5, more preferably of at least 5, more preferably of at least 10 and most preferably of at least 20.

Unexpected improvements can be achieved with compositions comprising solvents and wetting agents having a similar relative evaporation rate (Butyl acetate=100). Preferably, the difference of the relative evaporation rate (Butyl acetate=100) of the wetting agent and the organic solvent is in the range of −20 to 20, more preferably in the range of −10 to 10. According to a preferred embodiment of the present invention, the ratio of the relative evaporation rate (Butyl acetate=100) of the wetting agent to relative evaporation rate (Butyl acetate=100) of the organic solvent can range from 230:1 to 1:230, preferably from 20:1 to 1:20 and more preferably from 5:1 to 1:5.

Unexpected improvements can be achieved by wetting agents comprising a molecular weight of at least 100 g/mol, preferably at least 150 g/mol, more preferably at least 180 g/mol and most preferably at least 200 g/mol. Suitable and preferred wetting agents that do not oxidise or otherwise chemically react with the OSC materials are selected from the group consisting of siloxanes, alkanes, amines, alkenes, alkynes, alcohols and/or halogenated derivatives of these compounds. Furthermore, fluoro ethers, fluoro esters and/or fluoro ketones can be used. More preferably, these compounds are selected from methyl siloxanes having 6 to 20 carbon atoms, especially 8 to 16 carbon atoms; $C_7$-$C_{14}$ alkanes, $C_7$-$C_{14}$ alkenes, $C_7$-$C_{14}$ alkynes, alcohols having 7 to 14 carbon atoms, fluoro ethers having 7 to 14 carbon atoms, fluoro esters having 7 to 14 carbon atoms and fluoro ketones having 7 to 14 carbon atoms. Most preferred wetting agents are methylsiloxanes having 8 to 14 carbon atoms.

Examples of compounds useful and preferred as wetting agents are disclosed in WO 2011/076325 A1.

Preferably, the formulation comprises preferably at most 5% by weight, more preferably at most 3% by weight and most preferably at most 1% by weight of wetting additives. Preferably, the composition comprises 0.01 to 5% by weight, more preferably 0.05 to 3% by weight and most preferably 0.1 to 1% by weight of wetting agent.

Preferably, the solvent should be selected such that it can be evaporated from the coated or printed layer comprising the organic semiconducting material(s) together with the wetting agent, preferably in the same processing step. The processing temperature used for removing the solvent and the volatile additive should be selected such that the layer, comprising the organic semiconducting material(s), is not damaged. Preferably the deposition processing temperature is from 0° C. to 135° C., more preferably from 10° C. to 100° C. and most preferably from 10° C. to 80° C.

Preferably, the formulation of the present invention comprises a surface tension in the range of 20 to 60 mN/m, more preferably 25 to 45 mN/m. The surface tension can be measured using a FTA (First Ten Angstrom) 125 contact angle goniometer as mentioned above and below. The surface tension can be achieved by selection the organic semiconducting material(s) and the solvent in an appropriate manner. The use of the Hansen Solubility Parameters as mentioned above provides a useful aid for a person skilled in the art. Furthermore, the surface tension can be achieved by using a wetting agent, preferably a volatile wetting agent as mentioned above.

Preferably, the formulation has a viscosity in the range of 1.5 to 100 mPas, preferably in the range of 2.0 to 40 mPas, more preferably in the range of 2.1 to 20 mPas and most preferably in the range of 2.1 to 15 mPas. The viscosity is determined at a temperature of 25° C. by measuring on AR-G2 rheometer manufactured by TA Instruments. This is measured using a parallel plate geometry.

A further object of the present invention is a process for the preparation of the formulation of the present invention. This object is achieved in that the one or more organic semiconducting materials are dissolved in one or more organic solvents (i.e. the preparation of the formulation) and thereafter the formulation is filtered. Preferably, the formulation is filtered after its preparation by using one or more membrane filters. More preferably, the formulation is filtered after its preparation by using one or more membrane filters having a pore size of ≤2 μm, preferably a pore size of ≤500 nm, more preferably a pore size of ≤200 nm and most preferably a pore size selected in the range from ≤50 to ≤200 nm.

In a further preferred embodiment, the formulation is filtered after its preparation using a membrane filter more than once, preferably more than 3 times, more preferably more than 10 times and most preferably more than 100 times.

During the process of preparing a device, the layer, comprising the organic semiconducting material(s), is deposited onto a substrate, followed by removal of the solvent together with any volatile additive(s) present, to form a film or layer.

The substrate can be any substrate suitable for the preparation of OLED, OTFT, OFET, solar cell, sensor, organic diode or RFID devices, or can also be the OLED, OTFT, OFET, solar cell, sensor, organic diode or RFID device, or a part thereof. Suitable and preferred substrates are e.g. glass, ITO coated glass, ITO glass with pre coated layers including PEDOT, PANI, flexible films of polyethylene terephthalate (PET), polyethylene naphthalate (PEN), polyimide, and flexible films with ITO, or other conducting layers and barrier layers e.g. Vitex film.

Deposition of the layer, comprising the organic semiconducting material(s), can be achieved by standard methods that are known to the skilled person and are described in the literature. Suitable and preferred deposition methods include liquid coating and printing techniques. Very preferred deposition methods include, without limitation, dip coating, spin coating, ink jet printing, nozzle printing, letter-press printing, screen printing, gravure printing, doctor blade coating, roller printing, reverse-roller printing, offset lithography printing, flexographic printing, web printing, spray coating, curtain coating, brush coating, airbrush coating, slot dye coating or pad printing. Gravure, flexographic and inkjet printing are especially preferred.

Removal of the solvent and any volatile conductive additive(s) is preferably achieved by evaporation, for example by exposing the deposited layer to high temperature and/or reduced pressure, preferably at a temperature from 0° C. to 135° C., more preferably from 10° C. to 100° C. and most preferably from 10° C. to 80° C.

The thickness of the layer, comprising the organic semiconducting material(s), is preferably from 1 nm to 10 μm, more preferably from 1 nm to 500 nm, most preferably from 2 to 150 nm.

Further to the materials and methods as described above and below, the OLED device, OTFT device, OFET device, solar cell, sensor, organic diode or RFID device and its components can be prepared from standard materials and standard methods, which are known to the person skilled in the art and described in the literature.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the preferred embodiments, are inventive in their own right and not just as part of an embodiment of the present invention. Independent protection may be sought for these features in addition to or alternative to any invention presently claimed.

Unless the context clearly indicates otherwise, as used herein plural forms of the terms herein are to be construed as including the singular form and vice versa.

Throughout the description and claims of this specification, the words "comprise" and "contain" and variations of the words, for example "comprising" and "comprises", mean "including but not limited to", and are not intended to (and do not) exclude other components.

The term "polymer" includes homopolymers and copolymers, e.g. statistical, alternating or block copolymers. In addition, the term "polymer" as used hereinafter does also include oligomers and dendrimers. Dendrimers are typically branched macromolecular compounds consisting of a multifunctional core group onto which further branched monomers are added in a regular way giving a tree-like structure, as described e.g. in M. Fischer and F. Vögtle, *Angew. Chem., Int. Ed.* 1999, 38, 885.

The term "conjugated polymer" means a polymer containing in its backbone (or main chain) mainly C atoms with $sp^2$-hybridisation, or optionally sp-hybridisation, which may also be replaced by hetero atoms, enabling interaction of one π-orbital with another across an intervening σ-bond. In the simplest case this is for example a backbone with alternating carbon-carbon (or carbon-hetero atom) single and multiple (e.g. double or triple) bonds, but does also include polymers with units like 1,3-phenylene. "Mainly" means in this connection that a polymer with naturally (spontaneously) occurring defects, which may lead to interruption of the conjugation, is still regarded as a conjugated polymer. Also included in this meaning are polymers wherein the backbone comprises for example units like aryl amines, aryl phosphines and/or certain heterocycles (i.e. conjugation via N-, O-, P- or S-atoms) and/or metal organic complexes (i.e. conjugation via a metal atom). The term "conjugated linking group" means a group connecting two rings (usually aromatic rings) consisting of C atoms or hetero atoms with $sp^2$-hybridisation or sp-hybridisation. See also "IUPAC Compendium of Chemical terminology, Electronic version".

Unless stated otherwise, the molecular weight is given as the number average molecular weight $M_n$ or as weight average molecular weight $M_w$, which unless stated otherwise are determined by gel permeation chromatography (GPC) against polystyrene standards.

The degree of polymerization (n) means the number average degree of polymerization, unless stated otherwise given as $n=M_n/M_U$, wherein $M_U$ is the molecular weight of the single repeating unit.

The term "small molecule" means a monomeric, i.e. a non-polymeric compound.

Unless stated otherwise, percentages of solids are percent by weight ("wt. %"), percentages or ratios of liquids (like e.g. in solvent mixtures) are percent by volume ("vol. %"), and all temperatures are given in degrees Celsius (° C.).

Unless stated otherwise, concentrations or proportions of mixture components, like the conductive additives, given in percentages or ppm are related to the entire formulation including the solvents.

The invention will now be described in more detail by reference to the following examples, which are illustrative only and do not limit the scope of the present invention.

WORKING EXAMPLES

A. Polymer OLED Illumination Panel

For demonstration of the invention a polymer OLED light emission panel is made using a spin coating process. For the preparation a planar, bended glass sheet or planar, bended or flexible sheet of a polymer, e.g. PET, is used. The example is described using a planar glass sheet. On this glass sheet an OLED device is made using a conventional spin coating process as it is described e.g. in WO 2004/037887 A2 or in EP 1134269 A2.

On the glass or polymer substrate a transparent electrode is formed by evaporation or sputtering of an Indium-Tin-Oxide thin film in a conventional manner. The coated substrate is cleaned by rinsing in EL grade water and followed by rinsing in isopropanol and dried by blowing with dry nitrogen. After drying, the substrate was activated by an ozone plasma treatment for minutes.

For further coating three different coating inks are prepared to form a hole conducting layer, a hole injecting layer and a light emitting layer.

The following materials are formulated as inks for spin coating:

Hole conducting layer: PEDOT-PSS (Clevios A14083, Heraeus);
Hole injecting layer: HIL-012 (Merck);
Light emitting layer: SPW-138 (Merck);

Example 1

In a glove box under controlled and cleaned atmosphere (nitrogen, clean room class 100 according to US FED STD 209D or ISO Class 5 according to ISO 14644-1) the hole injecting and light emitting materials are dissolved in toluene (Lichrosolv, Merck) to form a 1 wt % solution of the solids.

Example 1a

The three inks according to Example 1 are filtered using a cascade of 3 planar membrane filters with a pore size of 2 μm/500 nm/200 nm (Entegris, type FL P1000 with pore size of 2 μm/500 nm/200 nm).

Example 1b

The filtration of the inks according to Example 1a is repeated twice,

Example 1c

The filtration of the inks according to Example 1a is repeated 100 times.

Samples of the inks according to Examples 1, 1a, 1b and 1c are measured on a particle counter (RION KS40BF) to count the particle content for particles larger than 200 nm.

The inks according to Example 1 and after the filtration of the inks according to Examples 1a to 1c the inks are coated by spin coating on the pre-treated ITO coated glass substrate and annealed to form an OLEO device as described in WO 2004/037887 A2.

After the coating and annealing process the device stack is coated by a Ba/Al counter electrode and sealed by an Al coating using conventional vacuum coating.

The layer thickness was 50 nm for the hole conducting layer, 20 nm for the hole injecting layer, and 50 nm for the emitting layer, followed by a 2 nm evaporated Ba layer and 100 nm of evaporated Al.

The devices show a white light emission with an efficiency of 13 lm/W at 1,000 cd/m$^2$.

The devices are investigated at a light emission of 1,000 nits by counting point defects in an optical microscope. Two kind of defects are identified:

Small defects of a diameter of about 0.5 to 20 μm (Black spots) and

Large defects of larger than 50 μm. These large defects create instability of the device and the defects are growing during the light emission of the device.

The data are shown in Table 6, as result of 5 devices for each example.

TABLE 6

| Example | Particle count Number of particles >500 nm/10 ml ink | Number of small defects (Black spots) per cm$^2$ | Number of large and growing defects per cm$^2$ |
|---|---|---|---|
| Example 1 | 1-5 × 10$^6$ | >100 | >10 |
| Example 1a | 1-3 × 10$^4$ | 1-3 | <1 |
| Example 1b | 300-500 | <0.2 | defect free |
| Exampie 1c | 10-20 | defect free | defect free |

After counting the defects, the devices are investigated in a scanning electron microscope (JEOL). All investigated black spots on the device show a structural damage on the devices of about 1 to 20 μm in diameter. Surprisingly in more than 80% of the investigated black spots the damage was caused by a particle of less than 1 μm and obviously without electrical activity.

The large defects are identified as damaged area carbonized by thermal overload due to a local pin hole or short cut. In some cases small metallic particles (Fe, Cr, Ni, Al) of less than 1 μm could be identified in the centre of the damaged area.

B. OLED TV Test Panel

For demonstration of the invention the properties of an OLED TV panel are shown on a three inch test substrate. This substrate has the pixel structure of an OLED TV panel, but only on a limited number of pixels to characterize the processes for production of a full panel.

The substrate consists of a glass carrier, a conventional electrode structure, made from Indium Tin Oxide according to a standard process and a bank structure, e.g. according to US 2003/0137242 A1. The test substrate simplifies the TV panel, if it uses a passive matrix contact pattern to electrically access each single pixel. The technology can be easily scaled and applied on a larger size TV panel by using a commercial thin film transistor active matrix pattern, made of thin film transistors.

On the selected substrate a three layer device is printed by ink jet printing on each pixel using three different inks. For performance testing, the device is made only as red emitting OLED device. It is made by inkjet coating of a hole injecting layer, a hole transporting layer and a red emitting layer. After printing of the emitting layer an electron injecting layer and a metallic contact is evaporated in a conventional vacuum processing way and the device is sealed. The preparation of the single pixel by ink jet was done on a standard process as described e.g. in WO 2010/093592 A1.

The three inks (Merck: MBL3-6620 for the hole injecting layer, MHL3-0119 for the hole transporting layer and MRE3-0117 for the red emitting layer) used for processing passed two different filtration treatments.

Example 2a

The inks are filtered by a 50 μm paper filter.

Example 2b

The inks passed 10 times a 100 nm membrane filter (Entegris FL-P1000, 0.1 μm), the red emitting ink (Merck: MRE3-0117) was additionally filtered using a 0.05 μm membrane filter (Entegris FL-P1000, 0.05 μm) for 10 times.

The particle content of the inks was measured by passing it through a commercial particle counter (RION KS40BF). The three inks treated according to Example 2a show a particle content of >8×10$^5$ particles of a size larger than 500 nm in 10 ml of each ink and a particle count of more than 4000 particles of a size lager than 2 μm in 10 ml ink. After the filtration treatment according to Example 2b the inks show a particle content of less than 100 particles of a size larger than 500 nm in 10 ml of each ink and less than 5 particles larger than 2 μm in 10 ml ink.

After processing the devices, each pixel was inspected by an optical inspection system to identify and measure black spots within the pixels.

On a total number of 19 test substrates the number of visible black spots are counted as shown in Table 7.

TABLE 7

Table 7: Counted number of black spots on in total 19 test substrates prepared with inks according to Examples 2a and 2b

|  | Number of black spots with a size ranging from >1 μm to 10 μm | Number of black spots with a size ranging from >10 μm to 20 μm |
|---|---|---|
| Inks according to Example 2a | >10,000 | >1,000 |
| Inks according to Example 2b | 70 | 59 |

By spectral analysis the size of the black spot, which indicates the damaged area of the OLED pixel, could be correlated to the size of a particle inside of the black spot, which causes the damage. The results are shown in Table 8.

TABLE 8

Table 8: Size of black spots and measured size of
the particle, which causes the related black spot

| Black spot size | μm | 1.8 | 4.9 | 7.6 | 9.8 | 12.7 | 19 | 19.4 |
|---|---|---|---|---|---|---|---|---|
| Particle size | μm | 1.0 | 1.5 | 2.3 | 4.1 | 4.3 | 2.8 | 3.7 |

Surprisingly it was found, that the size of the black spots are by a factor of 1.8 to 6.8 larger as the particles, which generate these black spots.

C. Organic Solar Cell

To demonstrate the invention on an organic solar cell a multi-cell array of small solar cells was created on a glass sheet of 2.5 cm×2.5 cm. On these glass sheet a transparent contact of a thickness of 100 nm based on ITO was coated using a state-of-the-art sputtering process. Directly before the further coating the substrate was cleaned in isopropanol and dried under nitrogen flow. An $O_2$ plasma treatment makes the substrates ready for further coating. On this substrates an organic solar cell stack was coated using a spin coat procedure in glove box under controlled and cleaned atmosphere (nitrogen, clean room class 100 according to US FED STD 209D or ISO Class 5 according to ISO 14644-1). For the spin coat process the following coating solutions were used.

A first coating solution of PEDOT:PSS (Poly(3,4-Ethyl-enedioxythiophene): Poly(styrenesulfonate), 1% by weight in water) and a second coating solution of P3HT/PCBM (Poly(3-Hexylthiophene)/[6,6]-Phenyl-C61-Butylacidmeth-ylester; ratio P3HT/PCBM 1/1 as 1% by weight solution in chlorobenzene).

Example 3a

Both coating solution were filtered by one pass through a 50 μm paper filter.

Example 3b

Both coating solution were filtered by pass through a combination of 50 μm paper filter and a 200 nm PTFE filter.

Example 3c

Both coating solutions are filtered once by a 50 μm paper filter and afterwards 30 times by a 200 nm PTFE filter.

After preparation the coating solutions are investigated with a particle counter (RION 41A). For the measurement channel for particles larger as 500 nm the particle counts are indicated in Table 9.

TABLE 9

Table 9: Range of particle count for coating
solutions prepared according to Example 3a-c

| | Example 3a | Example 3b | Example 3c |
|---|---|---|---|
| Number of particles >500 nm in 10 ml solution | 10,000-100,000 | 500-1,000 | 80-120 |

The first coating solution according to Example 3a-c was coated by spin coating (2000 rpm, 90 s) on the substrate, directly after the described plasma treatment. After the coating the sheet was heated at a hot plate for 10 min at 180° C. in air. The coating of the second coating solution was done also by spin coating (1,000 rpm, 60 s) in a glove box under controlled and cleaned atmosphere (nitrogen, clean room class 100 according to US FED STD 209D or ISO Class 5 according to ISO 14644-1). The coating was annealed at 180° C. on a hot plate under nitrogen for 10 min.

After this spin coating procedure the substrates were coated with a 100 nm Aluminium film in a standard lab vacuum coater by evaporation of the aluminium, using a shadow mask. The used shadow mask has 100 square shaped holes of 1 mm×1 mm and forms an aluminium contact pattern of 10×10 equidistant single aluminium squares on the surface of the coated substrate. The coated substrate was finally temperature treated on a hot plate under nitrogen (120° C., 10 min). As result a solar cell array of 100 small solar cells spots of 1 mm×1 mm was achieved an provided for measurement.

The electrical characterisation was done by taking the UN characteristic of each single cell on a solar cell tester, which radiates the total array with light of 1,000 W/m$^2$ from the side of the glass. Based on the measured U/V results the solar efficiency for each single dot was calculated. The achieved efficiency values for the different single solar cells vary from 0% (defect cell spot) to 1.65% maximum (defect free cell spot). To demonstrate the influence of the preparation with the different coating solutions according the Examples 3 a-c the results are grouped into three groups:

Defect cell spots: Efficiency from 0% to 0.5%
Damaged spots: Efficiency from 0.5% to 1.3%
Perfect spots: Efficiency from 1.3% to 1.65%

The results are collected in Table 10.

TABLE 10

Table 10: Average number of defect and damaged solar cell spots
for cell substrates with 100 spots prepared according to Example
3 a-c (average of 3 substrates for each example)

| | Defect cell spots | Damaged spots | Perfect cell spots |
|---|---|---|---|
| Example 3a | 22% | 63% | 15% |
| Example 3b | 2% | 22% | 76% |
| Example 3c | <1% | 12% | 88% |

After measurement the selected defect and damaged cell spots are inspected by an optical microscope.

For all of the defect spots directly on the cell area or very close to the cell area a damaged space could be identified and in nearly all of this damaged spaces black particles could be identified as major cause of the damage of the film structure of the cell of an area with an diameter up to 100 μm.

For the spots which are damaged the results of the optical inspection are different. In a share of more than 50% of the inspected damaged spots an disturbance of the film structure, identified as thickness variation of at least one of the layers films could be found. This thickness variation gets visible by an irregular shaped optical diffraction ring pattern around a centrum of the damage, which is related to an included particle in the film.

The invention claimed is:

1. A formulation comprising one or more organic semi-conducting materials and one or more organic solvents, wherein the formulation contains less than 10,000 particles per liter formulation having an average particle size in the range from 0.1 to 20 μm, wherein the organic semiconducting material is a low molecular weight material having a weight-average molecular weight of ≤2,000 g/mol.

2. The formulation according to claim 1, wherein the formulation contains less than 1,000 particles per liter formulation having an average particle size in the range from 0.2 to 20 µm.

3. The formulation according to claim 1, wherein the formulation contains less than 100 particles per liter formulation having an average particle size in the range from 0.5 to 20 µm.

4. The formulation according to claim 1, wherein the formulation contains less than 10 metallic and/or electronically conducting particles per liter formulation having an average particle size in the range from 0.1 to 20 µm.

5. The formulation according to claim 1, wherein the organic semiconducting material is selected from the group consisting of a hole injecting, hole transporting, electron blocking, light emitting, hole blocking, electron transporting, electron injecting and dielectric absorber material.

6. The formulation according to claim 1, wherein the formulation contains one solvent.

7. Formulation according to claim 6, wherein the solvent has a boiling point of ≥90° C.

8. The formulation according to claim 1, wherein the formulation contains at least two different solvents, wherein the difference of the boiling points of two solvents of the at least two different solvents is ≥10° C.

9. The formulation according to claim 1, wherein the formulation contains at least two different solvents, wherein the difference of the vapour pressure of two solvents of the at least two different solvents is ≥a factor of 2.

10. The formulation according to claim 1, wherein the formulation has a viscosity in the range of 1.5 to 100 mPas.

11. The formulation according to claim 1, wherein the formulation contains additives and/or auxiliaries.

12. The formulation according to claim 11, wherein the formulation contains as an additive at least one polymeric binder.

13. The formulation of claim 1, wherein the organic semiconducting material is a low molecular weight material having a weight-average molecular weight of ≤1,500 g/mol.

14. A method for the preparation of a formulation according to claim 1, comprising dissolving the one or more organic semiconducting materials in one or more organic solvents and thereafter filtering the formulation using one or more membrane filters, having a pore size of ≤2 µm.

15. The method according to claim 14, wherein the formulation is filtered by passing the membrane filter more than once, preferably more than 3 times, more preferably more than 10 times and most preferably more than 100 times.

16. The method for the preparation of at least one layer of an electronic device, wherein the at least one layer is prepared by dip coating, spin coating, ink jet printing, nozzle printing, letter-press printing, screen printing, gravure printing, doctor blade coating, roller printing, reverse-roller printing, offset lithography printing, flexographic printing, web printing, spray coating, curtain coating, brush coating, airbrush coating, slot dye coating or pad printing using the formulation according to claim 1.

17. The method according to claim 16, wherein the electronic device is selected from the group consisting of an OLED, an OTFT, an OFET, a solar cell, a sensor, an organic diode and a RFID.

18. A method comprising utilizing the formulation according to claim 1, for the preparation of at least one layer of an electronic device.

19. The method according to claim 18, wherein the electronic device is selected from the group consisting of an OLED, an OTFT, an OFET, a solar cell, a sensor, an organic diode and a RFID.

* * * * *